United States Patent
Jeng et al.

(10) Patent No.: US 11,605,600 B2
(45) Date of Patent: Mar. 14, 2023

(54) PACKAGE STRUCTURE WITH REINFORCED ELEMENT AND FORMATION METHOD THEREOF

(71) Applicant: Taiwan Semiconductor Manufacturing Company, Ltd., Hsinchu (TW)

(72) Inventors: Shin-Puu Jeng, Hsinchu (TW); Po-Yao Lin, Zhudong Township, Hsinchu County (TW); Shuo-Mao Chen, New Taipei (TW); Chia-Hsiang Lin, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 63 days.

(21) Appl. No.: 17/071,030

(22) Filed: Oct. 15, 2020

(65) Prior Publication Data
US 2022/0045016 A1 Feb. 10, 2022

Related U.S. Application Data

(60) Provisional application No. 63/061,828, filed on Aug. 6, 2020.

(51) Int. Cl.
*H01L 23/00* (2006.01)
*H01L 23/31* (2006.01)
(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/6835* (2013.01); *H01L 23/3128* (2013.01); *H01L 23/5383* (2013.01); *H01L 23/5386* (2013.01);
(Continued)

(58) Field of Classification Search
CPC ............... H01L 21/4857; H01L 21/486; H01L 2924/19103; H01L 23/49822; H01L 23/5383; H01L 23/49833; H01L 23/5385; H01L 23/4985; H01L 23/5387; H01L 23/14; H01L 23/49838–49844; H01L 23/5386; H01L 23/538–5389; H01L 23/3128; H01L 23/3114; H01L 23/5384; H01L 2224/24155; H01L 2224/24225–24227; H01L 2224/241–24265; H01L 2224/023–024
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Victor A Mandala
*Assistant Examiner* — Lawrence C Tynes, Jr.
(74) *Attorney, Agent, or Firm* — McClure, Qualey & Rodack, LLP

(57) ABSTRACT

A package structure and a formation method of a package structure are provided. The method includes forming multiple conductive vias in a carrier substrate and forming a redistribution structure over the carrier substrate. The redistribution structure has multiple polymer-containing layers and multiple conductive features. The method also includes disposing multiple chip structures over the redistribution structure. The method further includes bonding the carrier substrate to a package structure.

20 Claims, 45 Drawing Sheets

(51) Int. Cl.
*H01L 23/538* (2006.01)
*H01L 23/64* (2006.01)
*H01L 21/683* (2006.01)
*H01L 21/48* (2006.01)
*H01L 21/56* (2006.01)

(52) U.S. Cl.
CPC ............ *H01L 23/642* (2013.01); *H01L 24/16* (2013.01); *H01L 2221/68372* (2013.01); *H01L 2224/16227* (2013.01); *H01L 2924/19041* (2013.01); *H01L 2924/19103* (2013.01); *H01L 2924/3511* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,831,148 B2 * | 11/2017 | Yu .......................... H01L 24/16 |
| 2017/0263518 A1 * | 9/2017 | Yu ....................... H01L 23/3128 |
| 2017/0301650 A1 * | 10/2017 | Yu ....................... H01L 21/0217 |
| 2018/0315720 A1 * | 11/2018 | Liao ....................... H01L 21/563 |
| 2019/0123020 A1 * | 4/2019 | Yu .......................... H01L 24/83 |
| 2019/0326273 A1 * | 10/2019 | Bhagavat ................ H01L 25/18 |
| 2020/0161242 A1 * | 5/2020 | Lin ......................... H01L 24/08 |
| 2020/0204067 A1 * | 6/2020 | Dabral ................ H01L 23/5227 |
| 2021/0391283 A1 * | 12/2021 | Hsu ..................... H01L 23/5389 |

* cited by examiner

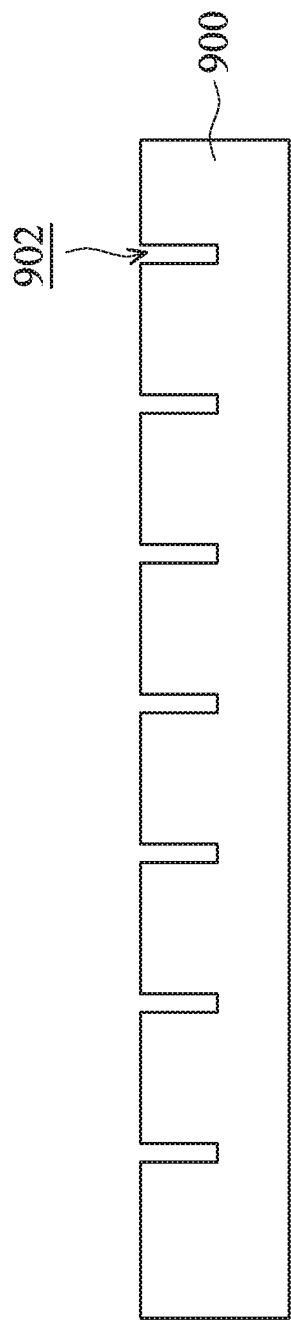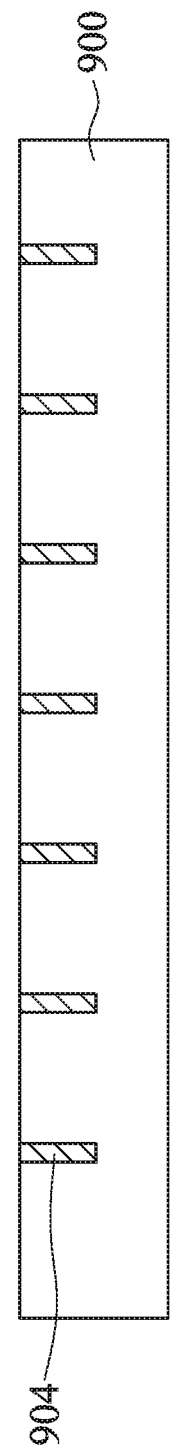

PACKAGE STRUCTURE WITH REINFORCED ELEMENT AND FORMATION METHOD THEREOF

PRIORITY CLAIM AND CROSS-REFERENCE

This Applications claims the benefit of U.S. Provisional Application No. 63/061,828, filed on Aug. 6, 2020, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 9A-9K are cross-sectional views of various stages of a process for forming a portion of a package structure, in accordance with some embodiments.

DETAILED DESCRIPTION

Figure 1A:
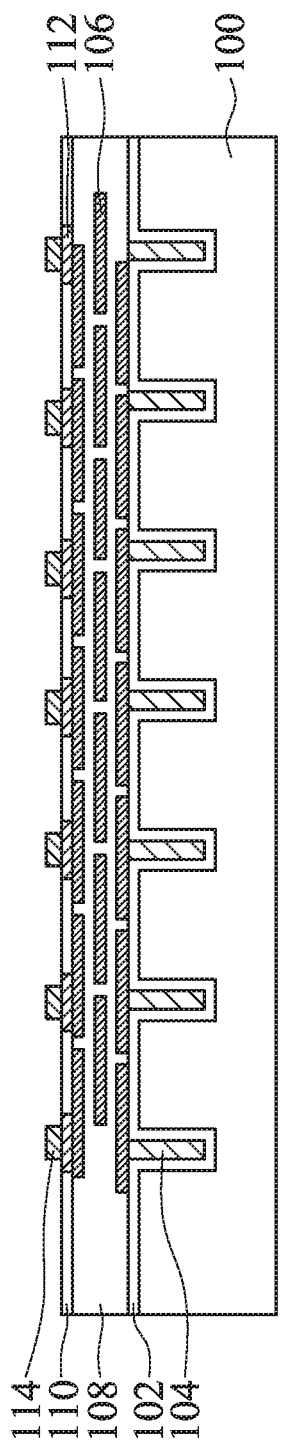
FIGS. 1A-1J are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher of what is specified, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10 degrees. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure and/or the package structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1J are cross-sectional views of various stages of a process for forming a package structure, in accordance with some embodiments. As shown in FIG. 1A, a carrier substrate 100 is provided or received. The carrier substrate 100 is used as a support substrate during the fabrication process. The carrier substrate 100 also functions as a reinforced plate that enhances the strength of the package structure, so as to prevent and/or reduce warpage of the package structure. The reliability and performance of the package structure are improved. In some embodiments, the carrier substrate 100 has a high strength and a low coefficient of thermal expansion (CTE). For example, the carrier substrate 100 has a coefficient of thermal expansion that is smaller than about 4 ppm, and the carrier substrate 100 has a modulus that is greater than about 75 MPa.

The carrier substrate 100 may be made of or include a semiconductor material, a dielectric material, one or more other suitable materials, or a combination thereof. The semiconductor material may be made of or include silicon, germanium, silicon germanium, one or more other suitable semiconductor materials, or a combination thereof. In some embodiments, the carrier substrate 100 is a semiconductor substrate, such as a silicon wafer. In some embodiments, the carrier substrate 100 is a dielectric substrate, such as a glass wafer. In some embodiments, the main body of the carrier substrate 100 is a single layer structure. The single material layer may be made of a semiconductor material (such as silicon), a dielectric material (such as a glass material), one or more other suitable materials, or a combination thereof.

In some embodiments, multiple conductive structures 104 are formed in the carrier substrate 100, as shown in FIG. 1A. The conductive structures 104 may function as conductive vias. In some embodiments, the carrier substrate 100 is partially removed to form multiple openings. The openings may be formed using one or more photolithography processes and one or more etching processes.

Afterwards, a dielectric layer 102 is deposited over the carrier substrate 100, as shown in FIG. 1A in accordance with some embodiments. The dielectric layer 102 extends along the sidewalls and bottoms of the openings. The dielectric layer 102 may be used to electrically isolate the carrier substrate 100 and the conductive structures 104 that will be formed later. The dielectric layer 102 may be made of or include silicon oxide, silicon oxynitride, silicon nitride, carbon-containing silicon oxide, carbon-containing silicon oxynitride, carbon-containing silicon nitride, silicon carbide, one or more other suitable materials, or a combination thereof. The dielectric layer 102 may be deposited using a chemical vapor deposition (CVD) process, an atomic layer deposition (ALD) process, a thermal oxidation process, one or more other applicable processes, or a combination thereof.

A conductive material is then deposited over the carrier substrate 100 to partially or completely fill the openings of the carrier substrate 100, as shown in FIG. 1A in accordance with some embodiments. The conductive material may be made of or include copper, aluminum, cobalt, tungsten, gold, titanium, platinum, one or more other suitable materials, or a combination thereof. The conductive material may be deposited using a physical vapor deposition (PVD) process, a CVD process, an ALD process, an electroplating process, an electroless plating process, one or more other applicable processes, or a combination thereof.

Afterwards, the conductive material is partially removed. As a result, the remaining portions of the conductive material form the conductive structures 104, as shown in FIG. 1A. A planarization process may be used to remove the portions of the conductive material outside of the openings. The remaining portions of the conductive material in the openings form the conductive structure 104. The planarization process may include a chemical mechanical polishing (CMP) process, a grinding process, an etching process, a dry polishing process, one or more other applicable processes, or a combination thereof.

As shown in FIG. 1A, an interconnection structure is formed over the carrier substrate 100 and the conductive structures 104, in accordance with some embodiments. The interconnection structure includes multiple dielectric layers 108 and multiple conductive features 106. The conductive features 106 may include conductive lines, conductive vias, and/or other suitable conductive structures. The conductive features 106 may be used to form electrical connection to the conductive structures 104.

The dielectric layers 108 may be made of or include silicon oxide, silicon oxynitride, silicon nitride, carbon-containing silicon oxide, carbon-containing silicon oxynitride, carbon-containing silicon nitride, silicon carbide, one or more other suitable materials, or a combination thereof. The conductive features 106 may be made of or include copper, aluminum, cobalt, tungsten, gold, titanium, platinum, one or more other suitable materials, or a combination thereof. The formation of the interconnection structure may involve multiple deposition processes, multiple patterning processes, and multiple planarization processes.

As shown in FIG. 1A, the interconnection structure may further include a passivation layer 110, conductive layers 112, and conductive pads 114. Each of the conductive pads 114 may be electrically connected to the respective conductive structures 104 through the respective conductive layer 112 and the respective conductive features 106.

Figure 1B:
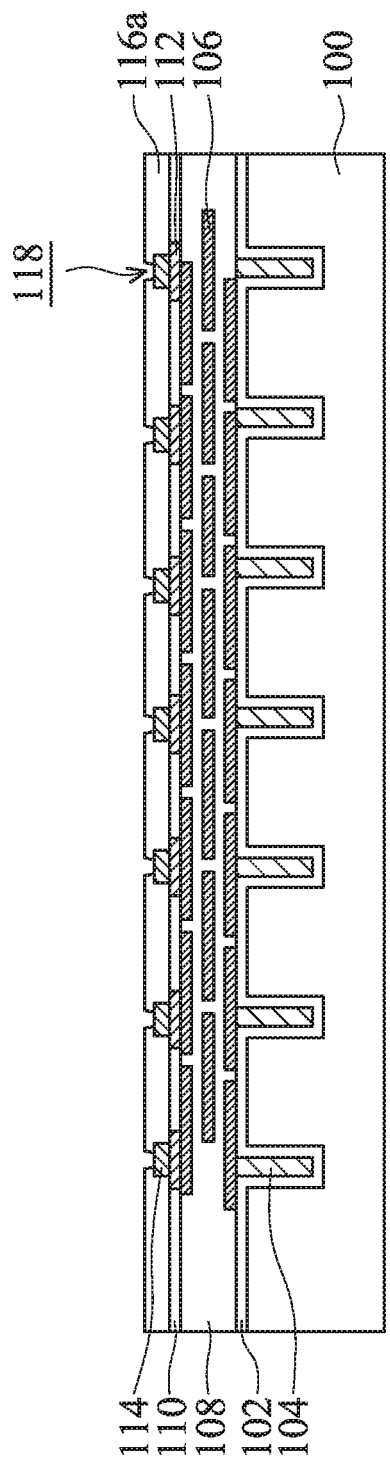

As shown in FIG. 1B, an insulating layer 116a is formed over the passivation layer 110 and the conductive pads 114, in accordance with some embodiments. In some embodiments, the insulating layer 116a is a polymer-containing layer. The insulating layer 116a may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings 118 with desired patterns in the insulating layer 116a. The openings 118 expose the conductive pads 114, as shown in FIG. 1B.

Figure 1C:
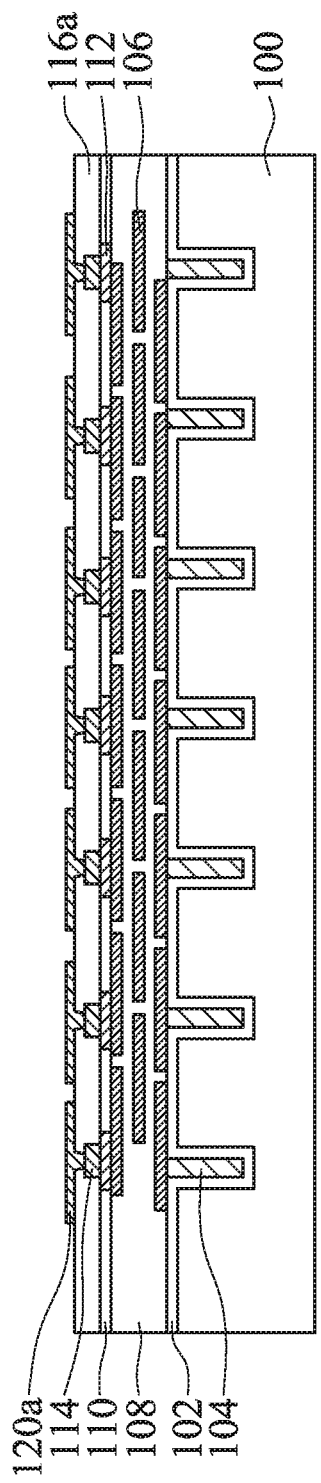

As shown in FIG. 1C, conductive features 120a are formed over the insulating layer 116a, in accordance with some embodiments. The conductive features 120a extend into the openings 118 to form electrical connection to the conductive pads 114. The conductive features 120a may be made of or include copper, cobalt, tin, titanium, gold, platinum, aluminum, tungsten, one or more other suitable materials, or a combination thereof. The conductive features 120a may be formed using an electroplating process, an electroless plating process, one or more other applicable processes, or a combination thereof.

Figure 1D:
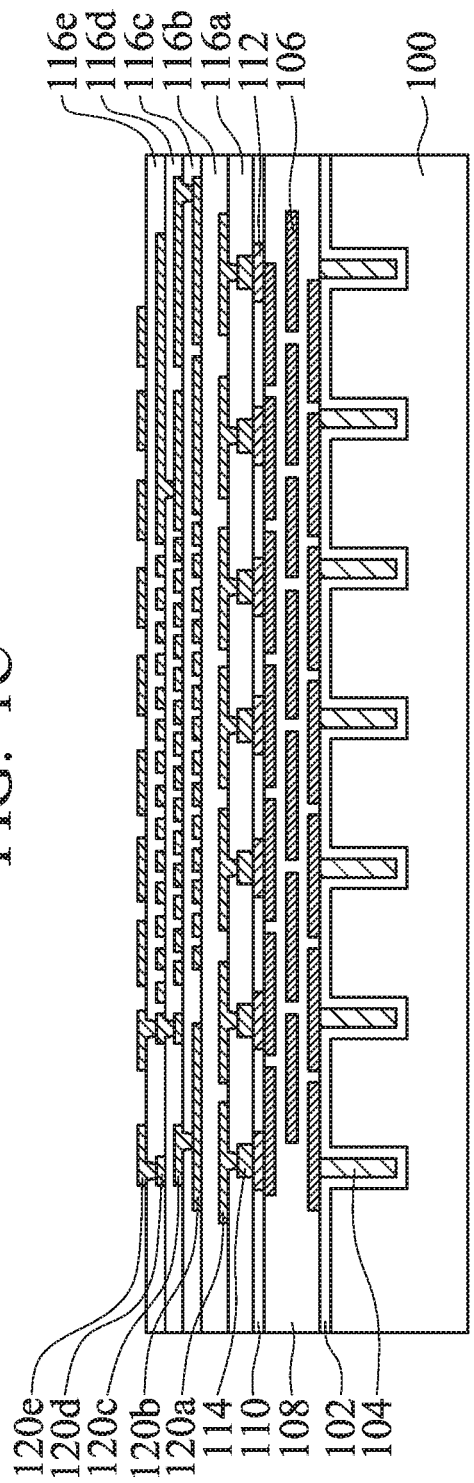

As shown in FIG. 1D, multiple insulating layers 116b-116e and multiple conductive features 120b-120e are formed over the insulating layer 116a and the conductive features 120a, in accordance with some embodiments. The material and formation method of the insulating layers 116b-116e may be the same as or similar to those of the insulating layer 116a. The material and formation method of the conductive features 120b-120e may be the same as or similar to those of the conductive features 120a.

Figure 1E:
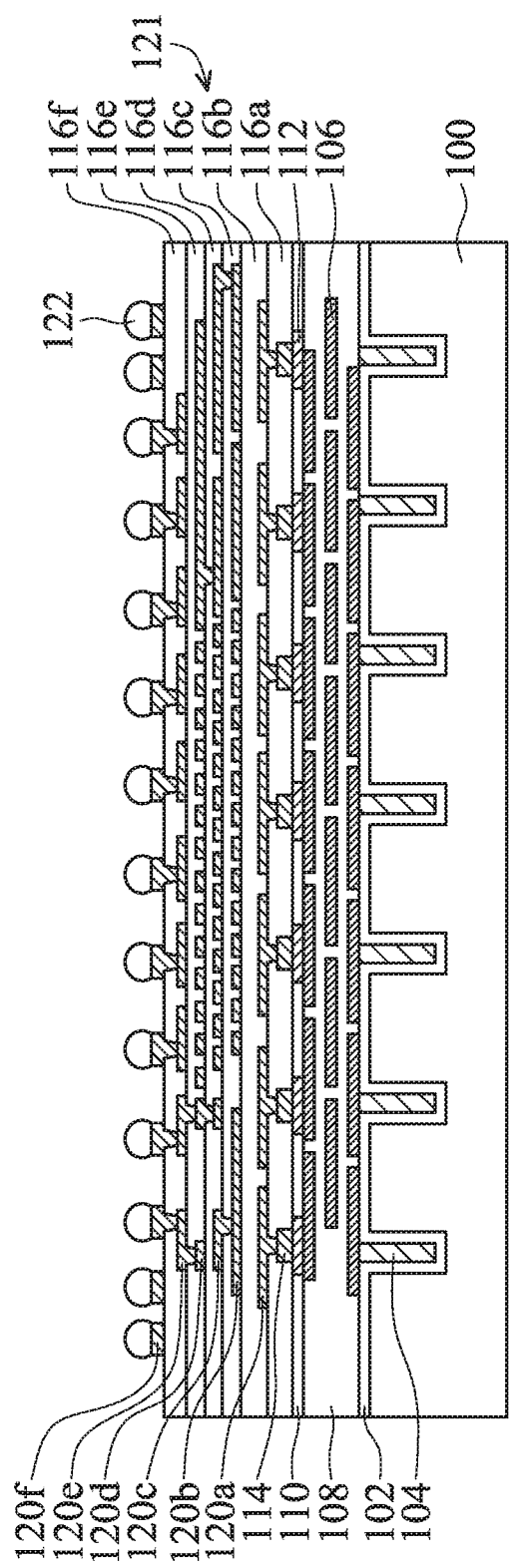

As shown in FIG. 1E, an insulating layer 116f and conductive features 120f are formed over the insulating layer 116e and the conductive features 120e, in accordance with some embodiments. The insulating layers 116a-116f and the conductive features 120a-120f together form a redistribution structure 121. As shown in FIG. 1E, some conductive features in the redistribution structure 121 are conductive vias. In some embodiments, the upper portion of the conductive via is wider than the lower portion of the conductive via, as shown in FIG. 1E.

The insulating layer 116f may function as a topmost insulating layer of the redistribution structure 121. The conductive features 120f may function as conductive pads and/or conductive pillars of the redistribution structure 121. For example, the conductive features 120f are used as under bump metallization (UBM) pads. The material and formation method of the insulating layer 116f may be the same as or similar to those of the insulating layer 116a. The material and formation method of the conductive features 120f may be the same as or similar to those of the conductive features 120a.

As shown in FIG. 1E, conductive connectors 122 are formed over the conductive features 120f, in accordance with some embodiments. In some embodiments, the conductive connectors 122 are made of or include a solder material. The solder material may be tin-containing material. The tin-containing material may further include copper, silver, gold, aluminum, lead, one or more other suitable materials, or a combination thereof. In some other embodiments, the solder material is lead-free. A thermal reflow operation may be performed to the conductive connectors 122. As a result, the reflowed conductive connectors 122 may have rounded profiles.

Figure 1F:
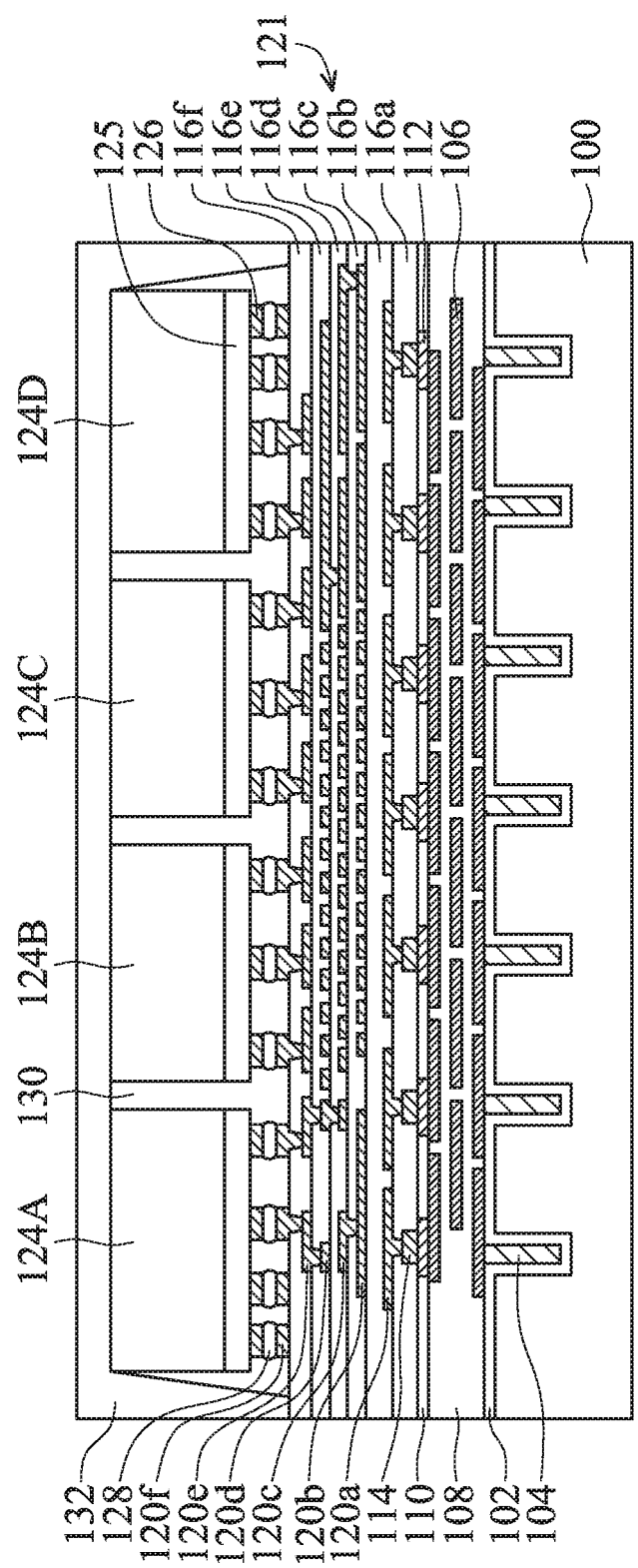
Figure 2:
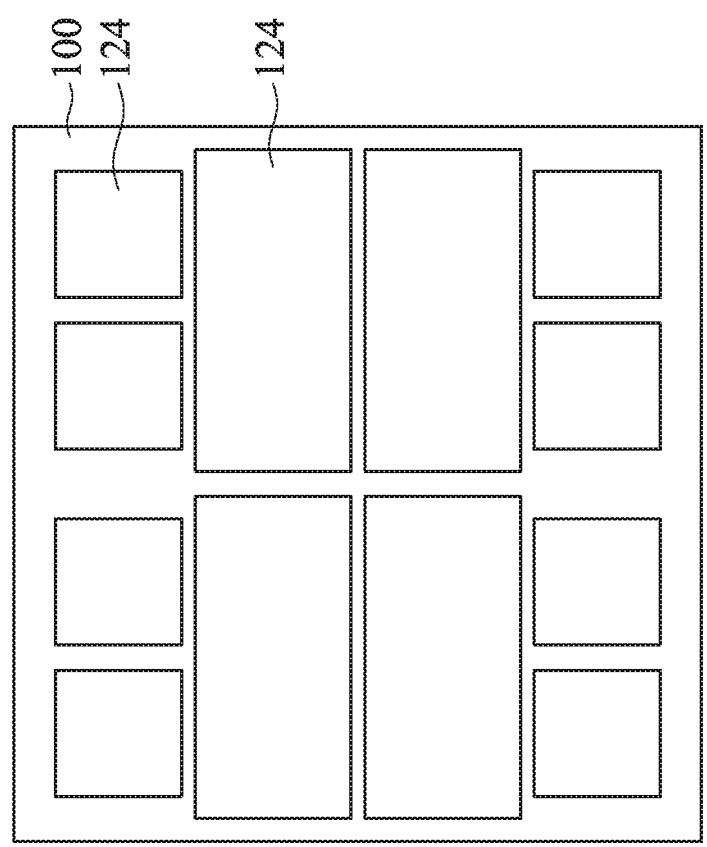
FIG. 2 is a top view of a portion of a package structure, in accordance with some embodiments.

As shown in FIG. 1F, multiple chip structures (or chip-containing structures) 124A, 124B, 124C, and 124D are disposed over the redistribution structure 121 formed over the carrier substrate 100, in accordance with some embodiments. FIG. 2 is a top view of a portion of a package structure, in accordance with some embodiments. FIG. 2 shows the distribution of the chip structures 124 disposed over the carrier substrate 100. In some embodiments, some of the chip structures 124 have different sizes and/or profiles, as shown in FIG. 2.

In some embodiments, the chip structures 124A-124D are bonded onto the conductive features 120f of the redistribution structure 121 through conductive connectors 128. In some embodiments, each of the chip structures 124A-124D includes conductive pillars 126 with solder elements formed thereon. The chip structures 124A-124D are picked and placed onto the redistribution structure 121. In some embodiments, the solder elements of the chip structures 124A-124D and the conductive connectors 122 are reflowed together. As a result, the conductive connectors 128 are formed. The chip structures 124A-124D and the redistribution structure 121 are bonded together through the conductive connectors 128.

The chip structures 124A-124D may be semiconductor dies and/or packages including one or more semiconductor dies that are encapsulated or protected. In some embodiments, some of the semiconductor dies are system-on-chip (SoC) chips that include multiple functions. In some embodiments, the back sides of the semiconductor dies face upwards with the front sides of the semiconductor dies facing the redistribution structure 121. In some embodiments, some of the semiconductor dies include memory devices such as high bandwidth memory (HBM) devices.

Each of the chip structures 124A-124D may include a semiconductor substrate, an interconnection structure 125, and the conductive pillars 126. In some embodiments, various device elements are formed in and/or on the semiconductor substrate of the chip structures 124A-124D. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the interconnection structure 125. The interconnection structure 125 may include multiple dielectric layers and multiple conductive features. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof.

As shown in FIG. 1F, an underfill material 130 is formed to surround and protect the conductive connectors 128, in accordance with some embodiments. A portion of the underfill material 130 may extend into a space between the nearby chip structures 124A-124D. The underfill material 130 may be made of or include a polymer material, such as an epoxy-based resin with fillers dispersed therein. The fillers may include fibers (such as silica fibers and/or carbon-containing fibers), particles (such as silica particles and/or carbon-containing particles), or a combination thereof.

As shown in FIG. 1F, a protective layer 132 is formed over the redistribution structure 121 to surround and protect the chip structures 124A-124D, in accordance with some embodiments. In some embodiments, the protective layer 132 is in physical contact with the redistribution structure 121. In some embodiments, the protective layer 132 is separated from the conductive connectors 128 below the chip structures 124A-124D by the underfill material 130.

However, embodiments of the disclosure are not limited thereto. Many variations and/or modifications can be made to embodiments of the disclosure. In some other embodiments, the underfill material 130 is not formed. In these cases, the protective layer 132 may be in direct contact with the conductive connectors 128 below the chip structures 124A-124D.

In some embodiments, the protective layer 132 is made of or includes an insulating material such as a molding material. The molding material may include a polymer material, such as an epoxy-based resin with fillers dispersed therein. The fillers may include fibers (such as silica fibers and/or carbon-containing fibers), particles (such as silica particles and/or carbon-containing particles), or a combination thereof. In some embodiments, the distribution density of the fillers in the protective layer 132 is greater than the distribution density of the fillers in the underfill material 130. The profiles, sizes, and/or materials of the fillers in the protective layer 132 and the underfill material 130 may be different from each other.

In some embodiments, a molding material (such as a liquid molding material) is introduced or injected to cover the redistribution structure 121 and the chip structures 124A-124D. In some embodiments, a thermal process is then used to cure the liquid molding material and to transform it into the protective layer 132. In some embodiments, a planarization process is performed to the protective layer 132 to improve the flatness of the protective layer 132. For example, the planarization process may include a grinding process, a CMP process, a dry polishing process, one or more other applicable processes, or a combination thereof.

Figure 1G:
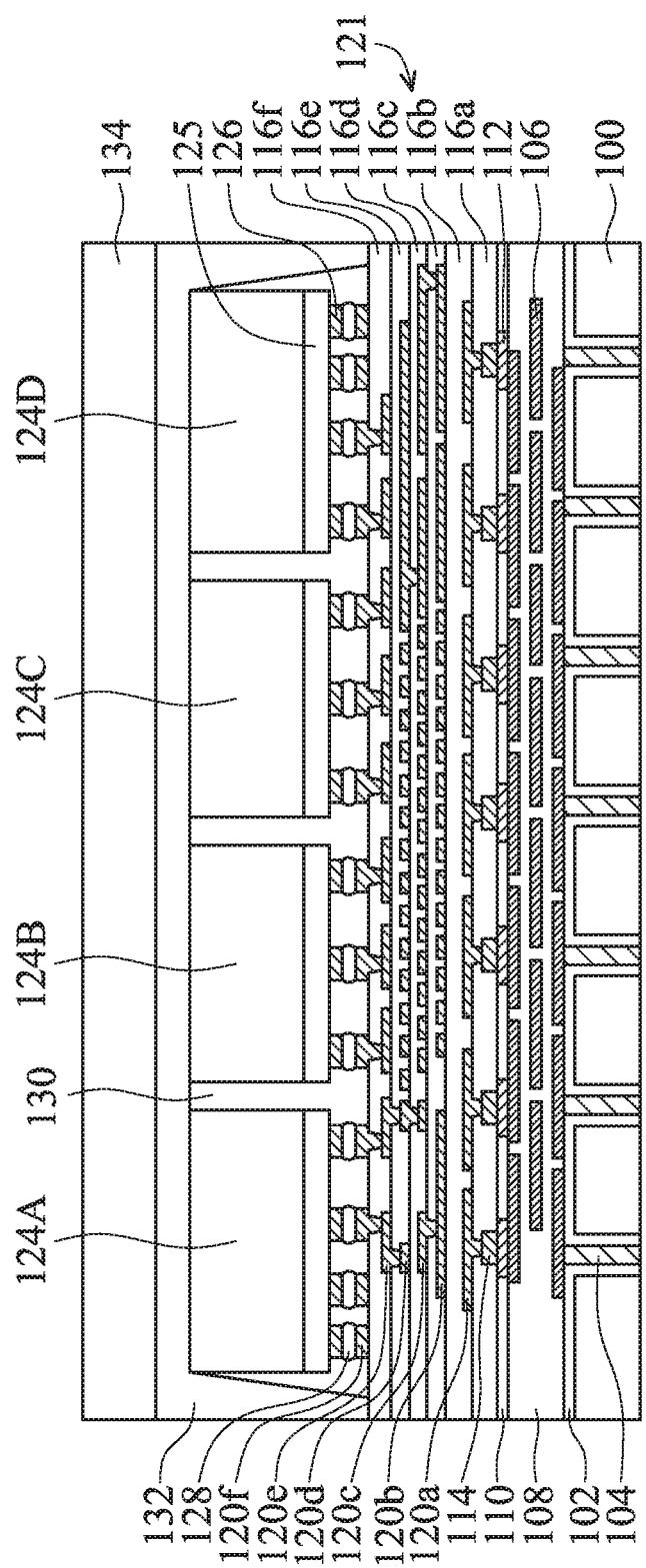

As shown in FIG. 1G, a temporary support substrate 134 is attached to the protective layer 132, in accordance with some embodiments. The temporary support substrate 134 may be made of a dielectric material, a semiconductor material, a metal material, one or more other suitable materials, or a combination thereof. For example, the temporary support substrate 134 is a silicon wafer or a glass wafer. In some embodiments, an adhesive tape or adhesive glue may be used to attach the temporary support substrate 134 to the protective layer 132.

As shown in FIG. 1G, the carrier substrate 100 is partially removed to expose the conductive structures 104, in accordance with some embodiments. The conductive structures 104 may penetrate through the carrier substrate 100 after the carrier substrate 100 is partially removed. The conductive structures 104 may completely penetrate through opposite surfaces of the carrier substrate 100. The conductive structures 104 may thus function as through substrate vias (TSVs) that form electrical connections between elements disposed over opposite surfaces of the carrier substrate 100. In some embodiments, a thinning process is used to partially remove the carrier substrate 100. The thinned carrier substrate 100 may function as a reinforced plate that enhances the strength of the package structure, so as to prevent and/or reduce warpage of the package structure. The reliability and performance of the package structure are improved. The thinning process may include a CMP process, a grinding process, an etching process, a dry polishing process, one or more other applicable processes, or a combination thereof.

The structure may be turned upside down with the bottom surface of the carrier substrate 100 facing upwards. Afterwards, the thinning process is applied on the surface to thin down the carrier substrate 100. As a result, the conductive structures 104 are exposed. In some embodiments, the conductive structures 104 slightly protrude from the surface of the carrier substrate 100 after the thinning of the carrier substrate 100. In some other embodiments, the ends of the conductive structures 104 are substantially level with the surface of the carrier substrate 100 after the thinning of the carrier substrate 100.

Figure 1H:
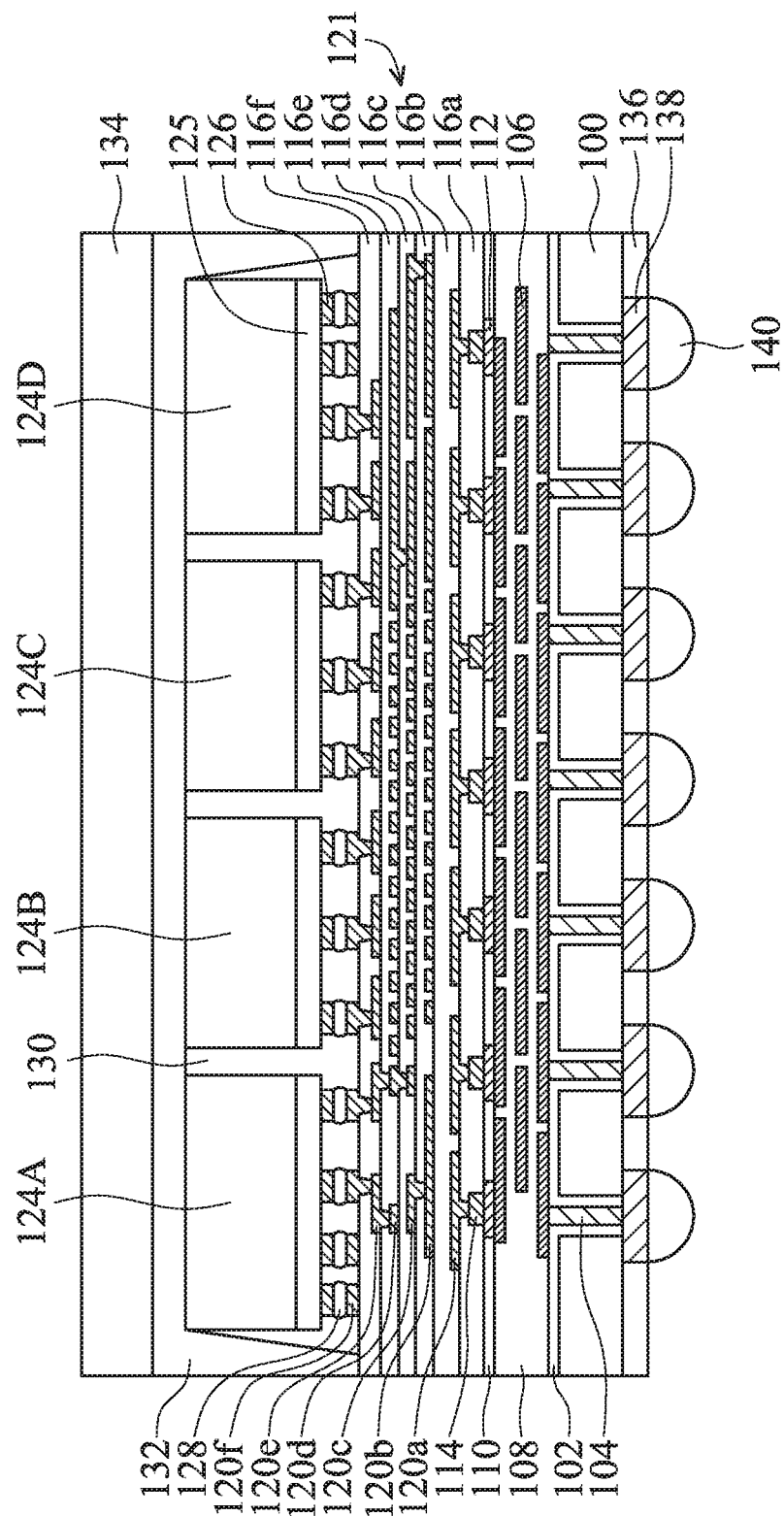

As shown in FIG. 1H, a protective layer 136 is formed over the surface of the carrier substrate 100, in accordance with some embodiments. The material and formation method of the protective layer 136 may be the same as or similar to those of the insulating layer 116f. Afterwards, the protective layer 136 is patterned to form openings that expose the conductive structures 104.

Afterwards, conductive pads 138 are formed in the openings to form electrical connection to the conductive structures 104, as shown in FIG. 1H in accordance with some embodiments. The material and formation method of the conductive pads 138 may be the same as or similar to those of the conductive features 120f. For example, the conductive pads 138 are used as UBM pads.

As shown in FIG. 1H, conductive connectors 140 are formed on the conductive pads 138, in accordance with some embodiments. The material and formation method of the conductive connectors 140 may be the same as or similar to those of the conductive connectors 122. In some embodiments, each of the conductive connectors 140 is wider and larger than each of the conductive connectors 122.

Figure 1I:
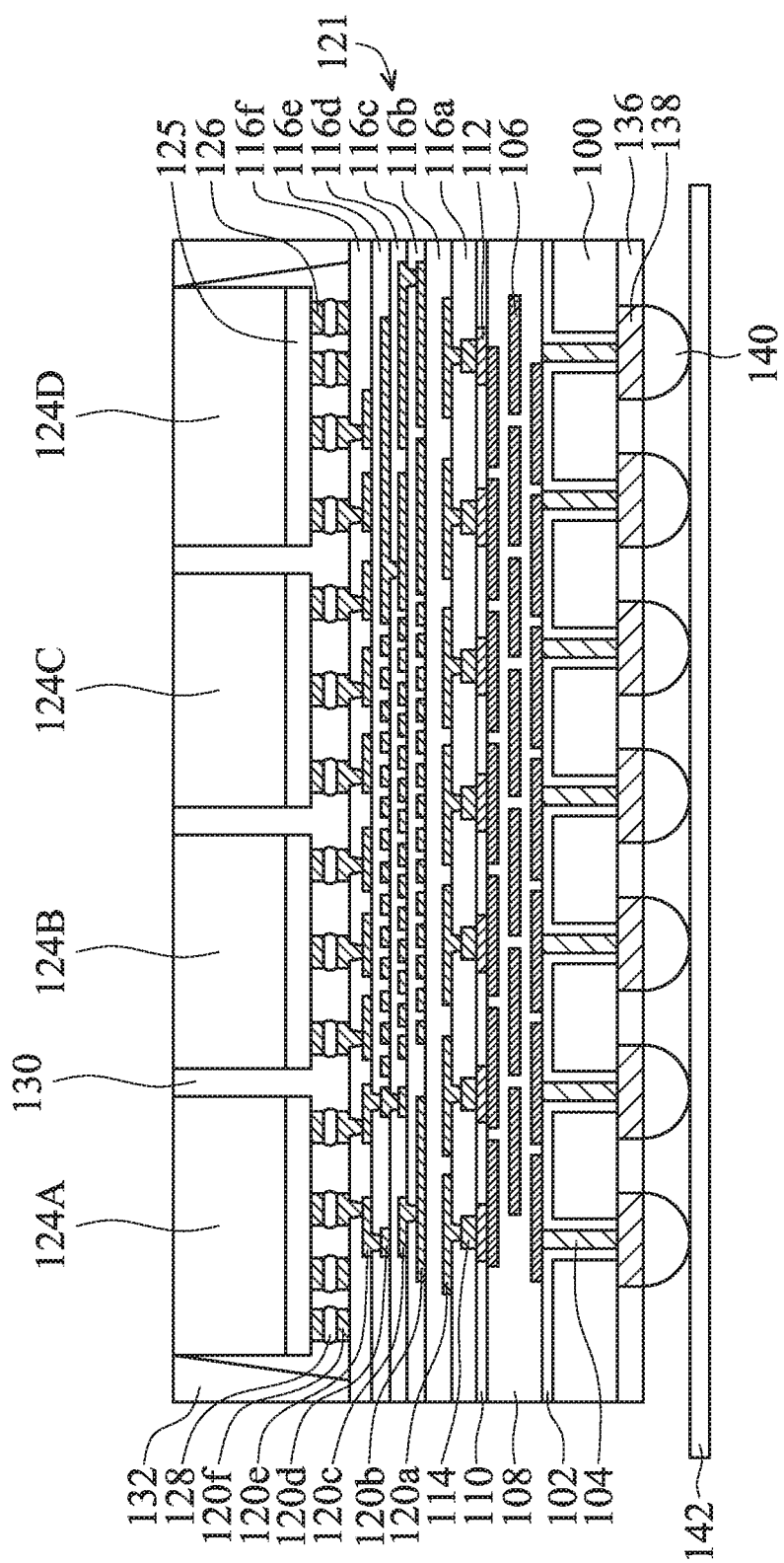

As shown in FIG. 1I, the structure in FIG. 1H is attached onto a carrier tape 142, in accordance with some embodiments. Afterwards, the temporary support substrate 134 is removed, and the protective layer 132 is further thinned to expose one or more of the chip structures 124A-124D, as shown in FIG. 1I in accordance with some embodiments. In some embodiments, each of the chip structures 124A-124D is exposed after the thinning of the protective layer 132. The heat dissipation of the chip structures 124A-124D may thus become better. The performance and reliability of the chip structures 124A-124D are improved. The thinning process may include a grinding process, an etching process, one or more other applicable processes, or a combination thereof.

In some embodiments, a sawing process is used to cut through the structure shown in FIG. 1I into multiple separate package structures. These package structures may then be integrated into other larger package structures.

However, embodiments of the disclosure are not limited thereto. Many variations and/or modifications can be made to embodiments of the disclosure. In some other embodiments, the sawing process is not performed to separate the structure in FIG. 1I into multiple smaller package structures. The entirety of the wafer-level package structure may then be integrated into a large package structure.

Figure 1J:
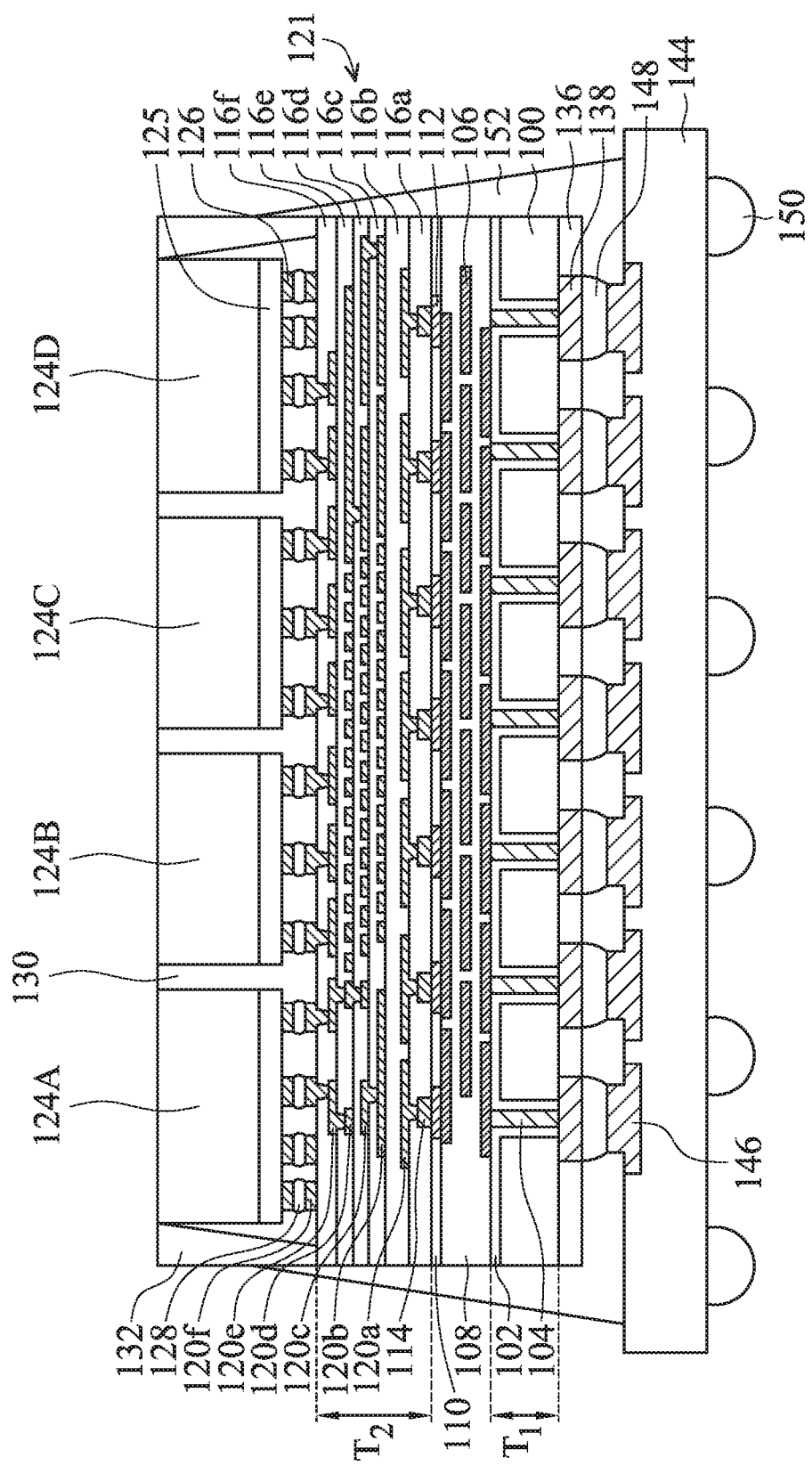

As shown in FIG. 1J, the package structure shown in FIG. 1I is picked from the carrier tape 142 and placed over a package substrate 144, in accordance with some embodiments. In some embodiments, the package structure shown in FIG. 1I is bonded to the package substrate 144 through conductive connectors 148. In some embodiments, the package substrate 144 includes multiple conductive pads 146 with solder elements formed thereon and multiple conductive bumps 150 formed on the opposite surface of the package substrate 144. The package substrate 144 may include one or more polymer layers and multiple conductive features. These conductive features form electrical connection between the conductive pads 146 and the conductive bumps 150. The package substrate 144 may include a core portion. The core portion may include organic materials such as materials that can be easily laminated. In some embodiments, the core portion may include a single-sided or double-sided copper clad laminate, epoxy, resin, glass fiber, molding compound, plastic (such as polyvinylchloride (PVC), acrylonitril, butadiene and styrene (ABS), polypropylene (PP), polyethylene (PE), polystyrene (PS), polymethyl methacrylate (PMMA), polyethylene terephthalate (PET), polycarbonates (PC), polyphenylene sulfide (PPS)), one or more other suitable elements, or a combination thereof. Conductive vias may extend through the core portion to provide electrical connections between elements disposed on either side of the core portion.

Afterwards, the package structure shown in FIG. 1I is disposed over the package substrate 144 such that the conductive connectors 140 are in physical contact with the solder elements formed on the conductive pads 146. Afterwards, a thermal reflow process is used. As a result, the conductive connectors 140 and the solder elements are reflowed together to form the conductive connectors 148.

In some embodiments, an underfill material 152 is formed to surround and protect the conductive connectors 148, in accordance with some embodiments. The material and formation method of the underfill material 152 may be the same as or similar to those of the underfill material 130 in FIG. 1F.

The redistribution structure 121 and the package substrate 144 may have a greater thermal expansion difference. As more and more chip structures are designed to be placed over the redistribution structure 121, the redistribution structure 121 is correspondingly formed to have a large area to receive these chip structures. As a result, the risk of warpage is further increased after bonding with the package substrate 144, which may negatively affect the reliability and performance of the package structure.

In some embodiments, the carrier substrate 100 (that functions as a reinforced plate) is substantially as wide as the redistribution structure 121. Due to the carrier substrate 100 having high strength and a low coefficient of thermal expansion, the thermal expansion difference between the package substrate 144 and the elements above the carrier substrate 100 may be limited. The risk of warpage is significantly reduced or prevented. Therefore, the reliability and performance of the package structure are greatly improved.

As shown in FIG. 1J, the carrier substrate 100 has a thickness $T_1$, and the redistribution structure 121 has a thickness $T_2$. In some embodiments, the thickness $T_2$ is greater than the thickness $T_1$. In some other embodiments, the thickness $T_2$ is substantially equal to the thickness $T_1$. The thickness $T_1$ of the carrier substrate 100 may be in a range from about 10 μm to about 100 μm. In some embodiments, the thickness ratio ($T_1/T_2$) of the thickness $T_1$ to the thickness $T_2$ is in a range from about 0.5 to about 1.

In some cases, if the thickness ratio ($T_1/T_2$) is smaller than about 0.5, the carrier substrate 100 might not be thickness enough to serve as a reinforced plate. As a result, there might be a high degree of warpage of the package structure, which would negatively affect the reliability and performance of the package structure. In some other cases, if the thickness ratio ($T_1/T_2$) is greater than about 1, the carrier substrate 100 might be too thick. If the carrier substrate 100 is too thick, high stress might be generated. As a result, the conductive connectors 148 might be damaged or negatively affected.

Figure 3:
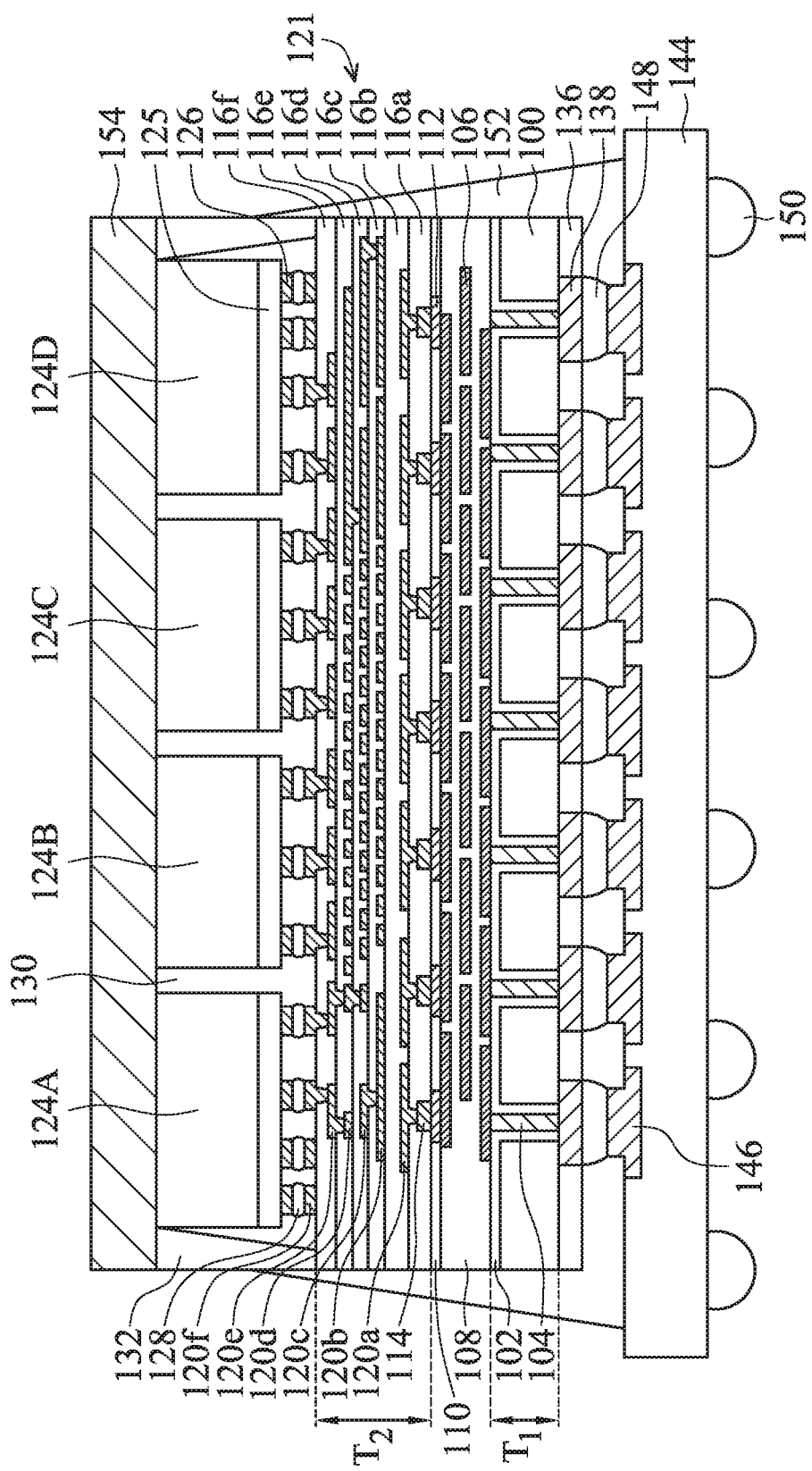
FIG. 3 is a cross-sectional view of a portion of a package structure, in accordance with some embodiments.

Many variations and/or modifications can be made to embodiments of the disclosure. FIG. 3 is a cross-sectional view of a portion of a package structure, in accordance with some embodiments. In some embodiments, a package structure similar to the structure shown in FIG. 1J is formed. A thermal conductive structure 154 is formed over the chip structures 124A-124D, as shown in FIG. 3 in accordance with some embodiments. The thermal conductive structure 154 may be made of or include copper, aluminum, gold, one or more other suitable materials, or a combination thereof. In some embodiments, the thermal conductive structure 154 is in physical contact with the chip structures 124A-124D. In some other embodiments, a thermal conductive glue may be used to attach the thermal conductive structure 154 to the chip structures 124A-124D. Due to the thermal conductive structure 154, the heat dissipation of the chip structures 124A-124D may be improved, which results in better performance and reliability of the chip structures 124A-124D.

Many variations and/or modifications can be made to embodiments of the disclosure. For example, in some embodiments, the redistribution structure is formed directly on the carrier substrate. There is no interconnection structure formed between the redistribution structure and the carrier substrate.

Figure 4A:
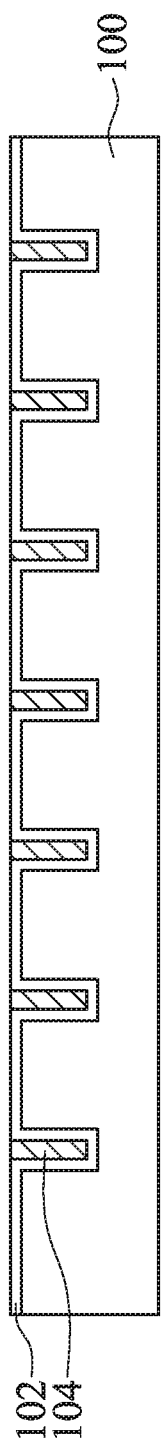
FIGS. 4A-4J are cross-sectional views of various stages of a process for forming a portion of a package structure, in accordance with some embodiments.

FIGS. 4A-4J are cross-sectional views of various stages of a process for forming a portion of a package structure, in accordance with some embodiments. As shown in FIG. 4A, a carrier substrate 100 is received or provided. The material of the carrier substrate 100 in FIG. 4A may be the same as or similar to that of the carrier substrate 100 in FIG. 1A. Similar to the embodiments in FIG. 1A, conductive structures 104 and a dielectric layer 102 are formed, as shown in FIG. 4A in accordance with some embodiments. The materials and formation methods of the conductive structures 104 and the dielectric layer 102 in FIG. 4A are the same as or similar to those of the conductive structures 104 and the dielectric layer 102 in FIG. 1A.

Figure 4B:
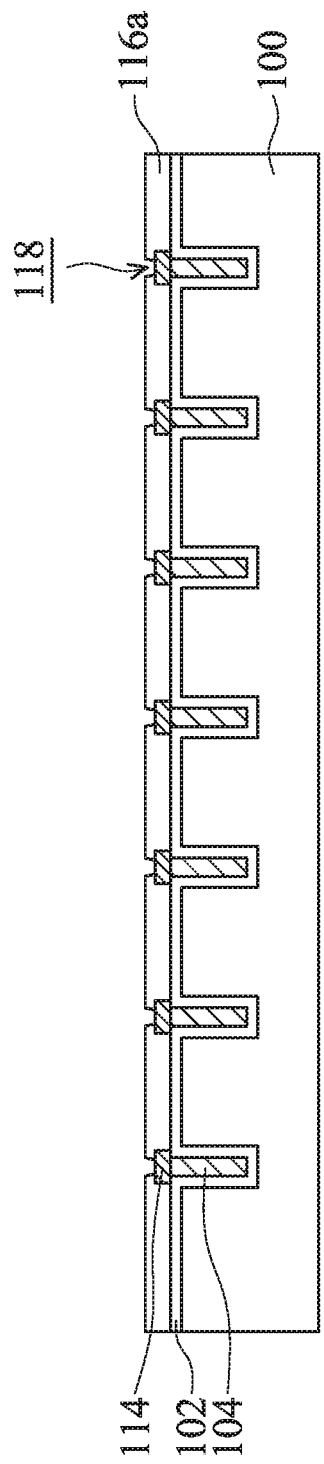

As shown in FIG. 4B, conductive pads 114 and an insulating layer 116a are formed directly on the carrier substrate 100, in accordance with some embodiments. The material and formation method of the conductive pads 114 in FIG. 4B may be the same as or similar to those of the conductive pads 114 in FIG. 1A. The material and formation method of the insulating layer 116a in FIG. 4B may be the same as or similar to those of the insulating layer 116a in FIG. 1B. Unlike the embodiments illustrated in FIG. 1A, the elements 106, 108, 110, and 112 are not formed in the embodiments illustrated in FIG. 4B. In some embodiments, each of the conductive pads 114 is in physical contact with the respective conductive structure 104. Afterwards, the insulating layer 116a with multiple openings 118 are formed over the carrier substrate 100 and the conductive pads 114. The openings 118 expose the conductive pads 114. In some embodiments, the insulating layer 116a is in physical contact with the dielectric layer 102 formed on the carrier substrate 100 and the conductive pads 114. In some other embodiments, the portion of the dielectric layer 102 on the top surface of the carrier substrate 100 is removed during the formation of the conductive structures 104. In these cases, the insulating layer 116a may be in physical contact with the carrier substrate 100.

Figure 4C:
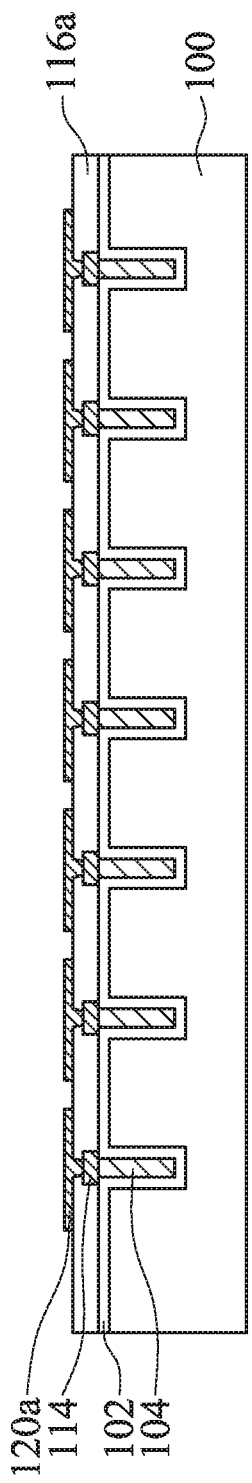

As shown in FIG. 4C, conductive features 120a are formed over the insulating layer 116a, in accordance with some embodiments. Each of the conductive features 120a may extend into the respective opening 118 to form electrical connection to the respective conductive structure 104 through the respective conductive pad 114. The material and formation method of the conductive features 120a in FIG. 4C may be the same as or similar to those of the conductive features 120a in FIG. 1C.

Figure 4D:
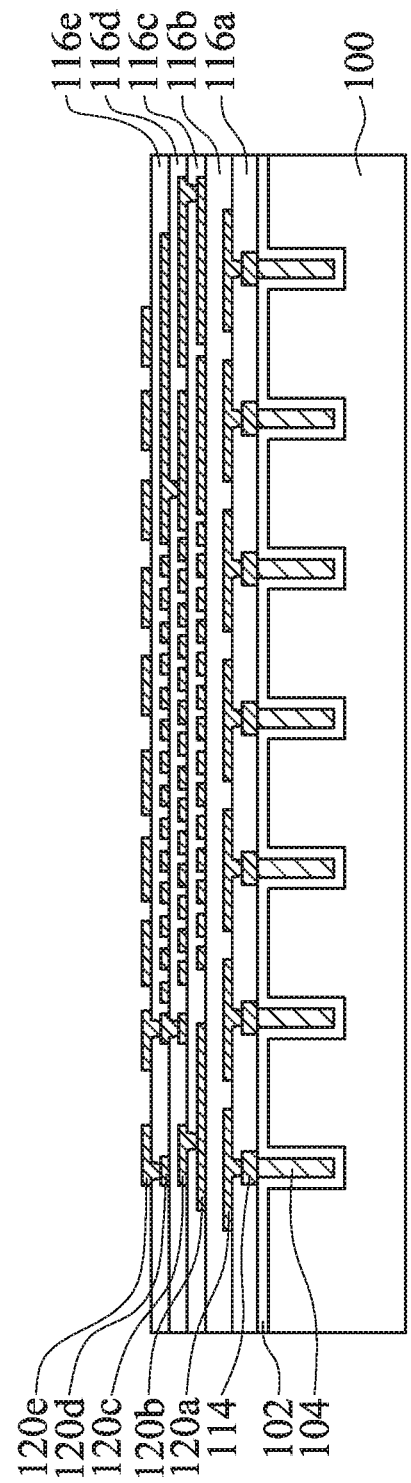

As shown in FIG. 4D, multiple insulating layers 116b-116e and multiple conductive features 120b-120e are formed over the insulating layer 116a and the conductive features 120a, in accordance with some embodiments. The material and formation method of the insulating layers 116b-116e may be the same as or similar to those of the insulating layer 116a. The material and formation method of the conductive features 120b-120e may be the same as or similar to those of the conductive features 120a.

Figure 4E:
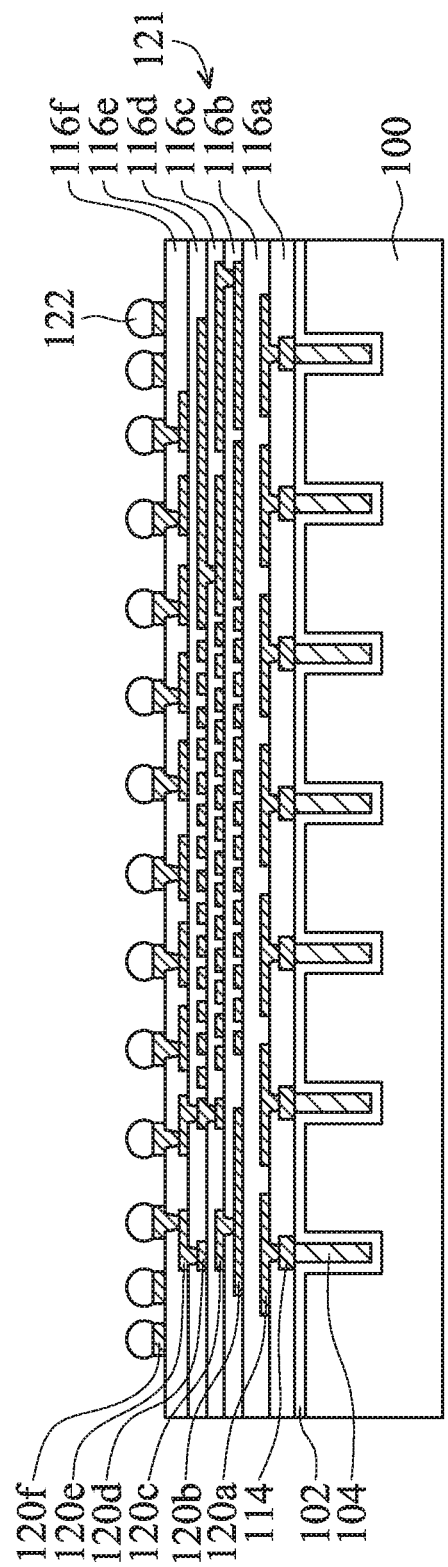

As shown in FIG. 4E, an insulating layer 116f and conductive features 120f are formed over the insulating layer 116e and the conductive features 120e, in accordance with some embodiments. The insulating layers 116a-116f and the conductive features 120a-120f together form a redistribution structure 121. The insulating layer 116f may function as a topmost insulating layer of the redistribution structure 121. The conductive features 120f may function as conductive pads and/or conductive pillars of the redistribution structure 121. For example, the conductive features 120f are used as under bump metallization (UBM) pads. The material and formation method of the insulating layer 116f may be the same as or similar to those of the insulating layer 116a. The material and formation method of the conductive features 120f may be the same as or similar to those of the conductive features 120a.

As shown in FIG. 4E, conductive connectors 122 are formed over the conductive features 120f, in accordance with some embodiments. The material and formation method of the conductive connectors 122 in FIG. 4E may be the same as or similar to those of the conductive connectors 122 in FIG. 1E.

Figure 4F:
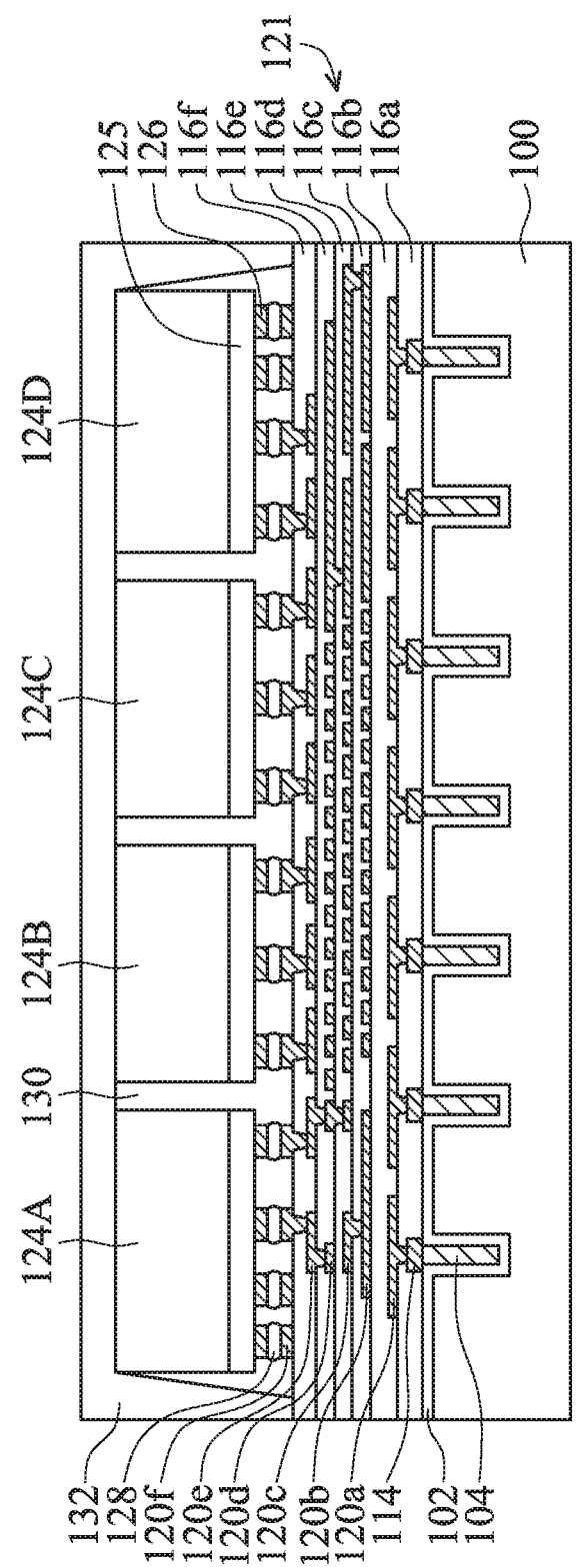

As shown in FIG. 4F, similar to the embodiments shown in FIG. 1F, multiple chip structures including chip structures 124A, 124B, 124C, and 124D are disposed over the redistribution structure 121 formed over the carrier substrate 100, in accordance with some embodiments. Similar to the chip structures 124A-124D in FIG. 1F, the chip structures 124A-124D in FIG. 4F may be semiconductor dies and/or packages including one or more semiconductor dies that are encapsulated or protected.

In some embodiments, the chip structures 124A-124D are bonded onto the conductive features 120f of the redistribution structure 121 through conductive connectors 128. The material and formation method of the conductive connectors 128 in FIG. 4F may be the same as or similar to those of the conductive connectors 128 in FIG. 1F.

As shown in FIG. 4F, an underfill material 130 is formed to surround and protect the conductive connectors 128, in accordance with some embodiments. The material and formation method of the underfill material 130 in FIG. 4F may be the same as or similar to those of the underfill material 130 in FIG. 1F.

As shown in FIG. 4F, a protective layer 132 is formed over the redistribution structure 121 to surround and protect the chip structures 124A-124D, in accordance with some embodiments. The material and formation method of the protective layer 132 in FIG. 4F may be the same as or similar to those of the protective layer 132 in FIG. 1F.

Figure 4G:
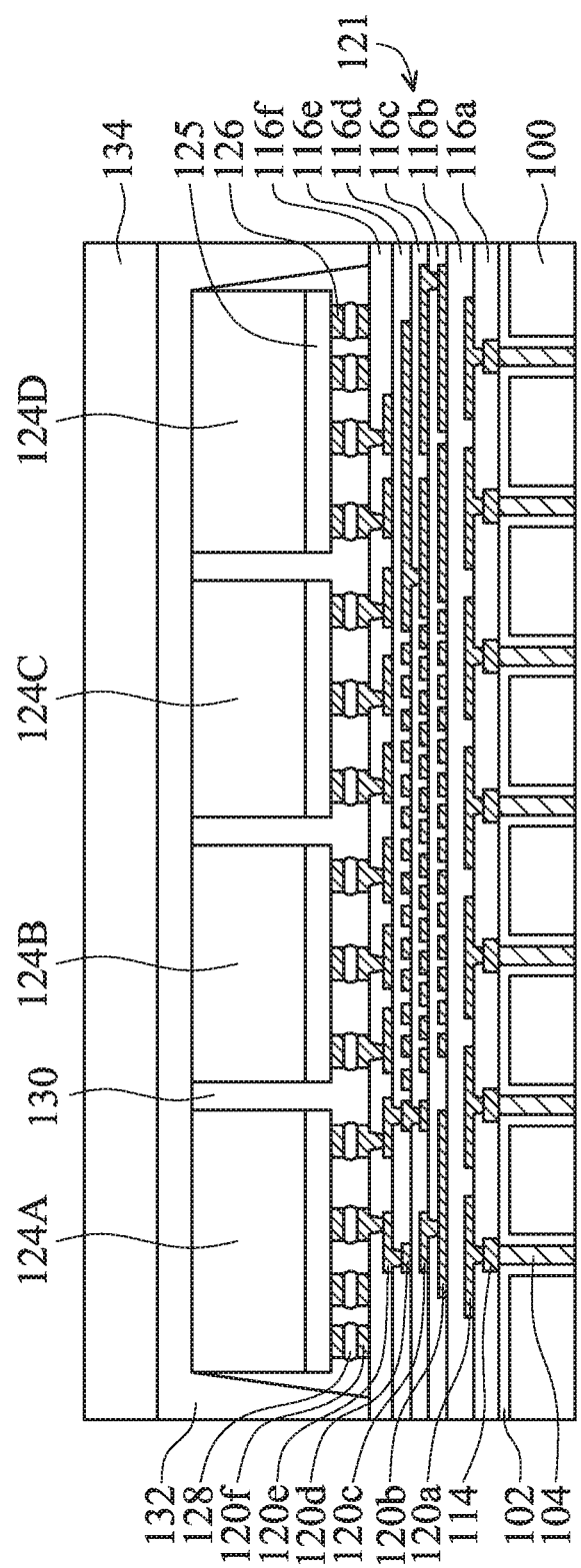

As shown in FIG. 4G, similar to the embodiments illustrated in FIG. 1G, a temporary support substrate 134 is attached to the protective layer 132, in accordance with some embodiments. The material of the temporary support substrate 134 in FIG. 4G may be the same as or similar to that of the temporary support substrate 134 in FIG. 1G.

As shown in FIG. 4G, similar to the embodiments illustrated in FIG. 1G, the carrier substrate 100 is partially removed to expose the conductive structures 104, in accordance with some embodiments. The conductive structures 104 may penetrate through the carrier substrate 100 after the carrier substrate 100 is partially removed. In some embodiments, a thinning process is used to partially remove the carrier substrate 100. The thinned carrier substrate 100 may function as a reinforced plate that enhances the strength of the package structure, so as to prevent and/or reduce warpage of the package structure. The reliability and performance of the package structure are improved.

Figure 4H:
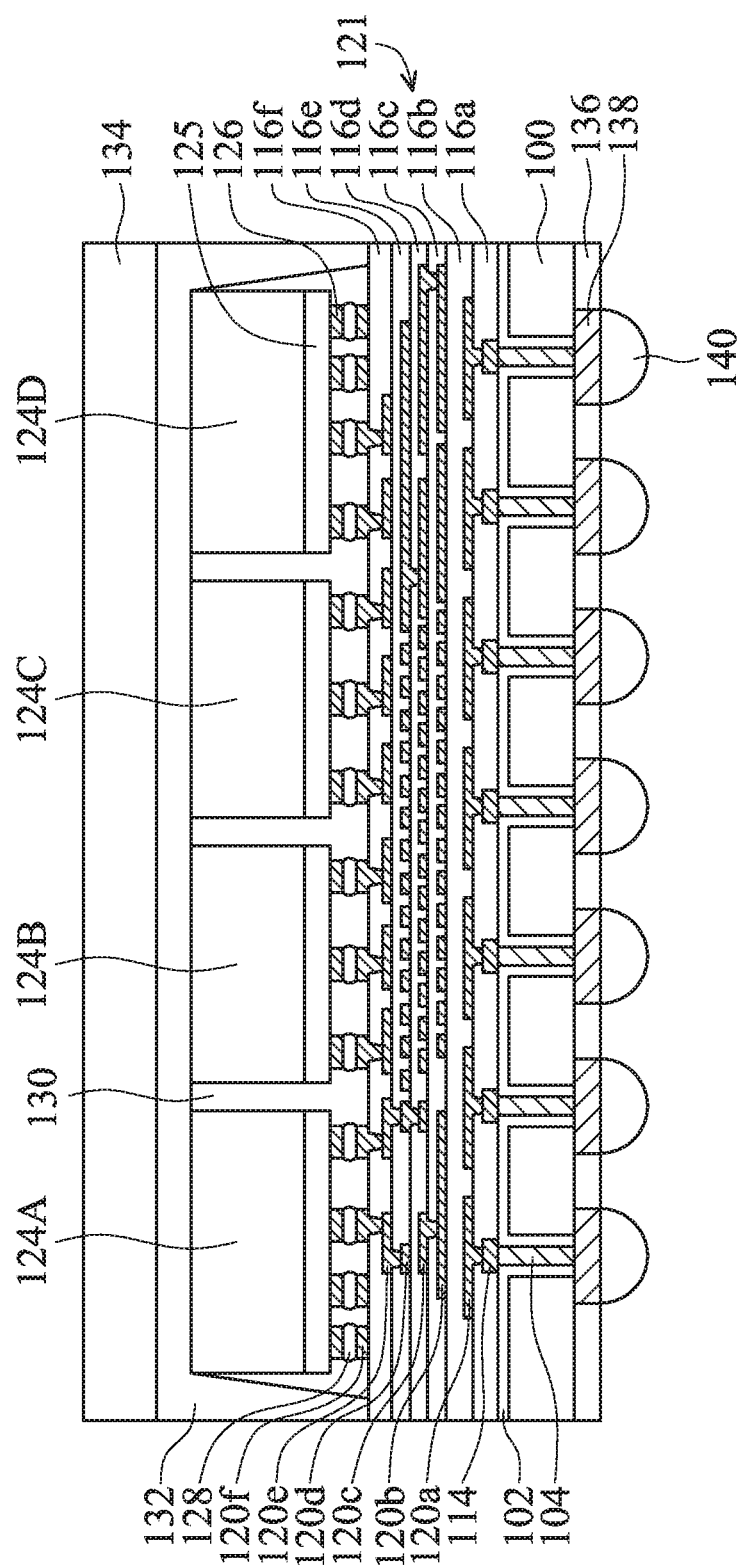

As shown in FIG. 4H, a protective layer 136, conductive pads 138, and conductive connectors 140 are formed, in accordance with some embodiments. The material and formation method of the protective layer 136, the conductive pads 138, and the conductive connectors 140 in FIG. 4H may be the same as or similar to those of the protective layer 136, conductive pads 138, and conductive connectors 140 in FIG. 1H.

Figure 4I:
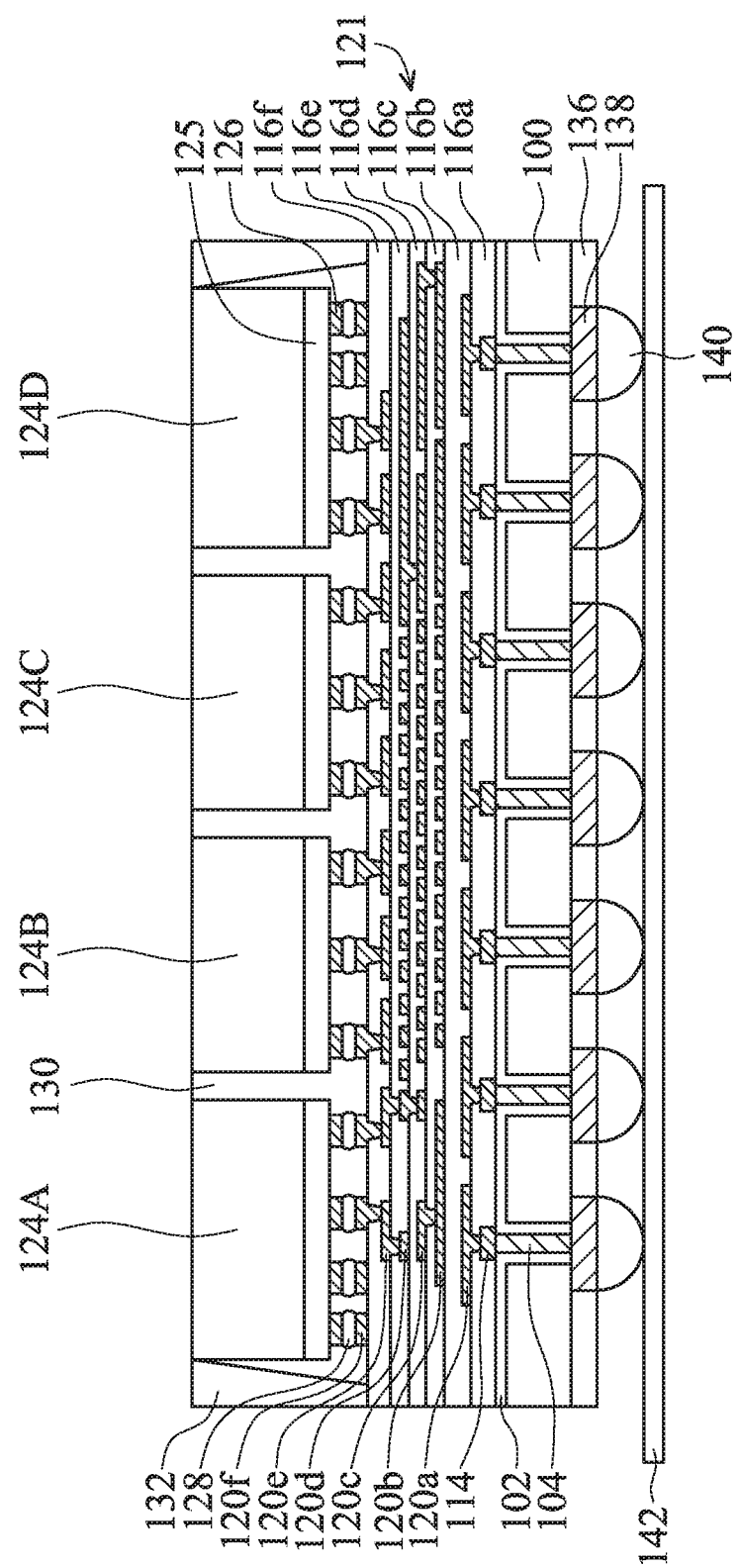

As shown in FIG. 4I, the structure in FIG. 4H is attached onto a carrier tape 142, in accordance with some embodiments. Afterwards, the temporary support substrate 134 is removed, and the protective layer 132 is further thinned to expose one or more of the chip structures 124A-124D, as shown in FIG. 4I in accordance with some embodiments. In some embodiments, each of the chip structures 124A-124D is exposed after the thinning of the protective layer 132.

In some embodiments, a sawing process is used to cut through the structure shown in FIG. 4I into multiple separate package structures. These package structures may then be integrated into other larger package structures.

However, embodiments of the disclosure are not limited thereto. Many variations and/or modifications can be made to embodiments of the disclosure. In some other embodiments, the sawing process is not performed to separate the structure in FIG. 4I into multiple smaller package structures. The entirety of the wafer-level package structure may then be integrated into a large package structure.

Figure 4J:
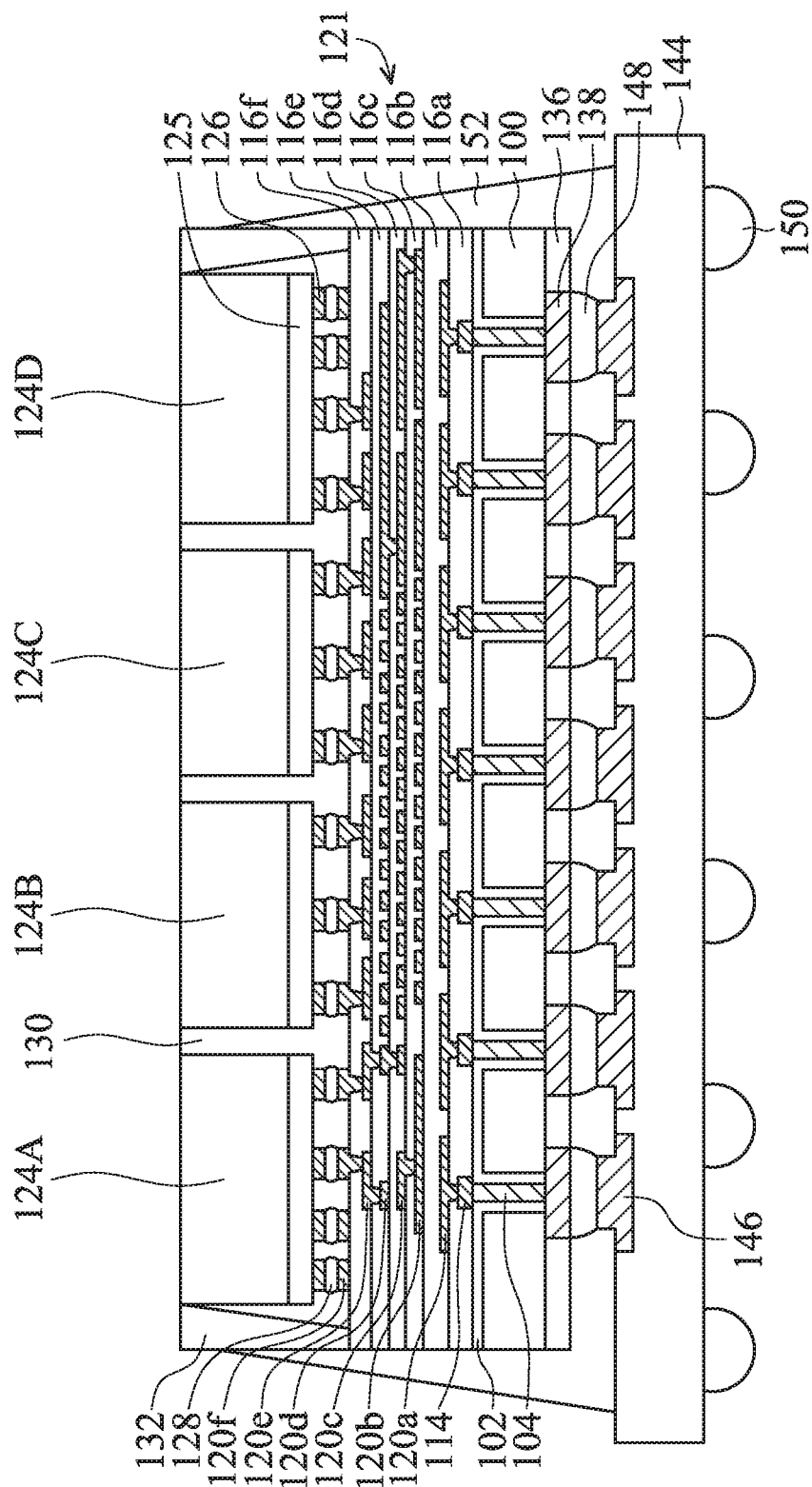

As shown in FIG. 4J, the package structure shown in FIG. 4I is picked from the carrier tape 142 and placed over a package substrate 144, in accordance with some embodiments. The package substrate 144 in FIG. 4J may be the same as or similar to the package substrate 144 in FIG. 1J. In some embodiments, the package structure shown in FIG. 4I is bonded to the package substrate 144 through conductive connectors 148. The material and formation method of the conductive connectors 148 in FIG. 4J may be the same as or similar to those of the conductive connectors 148 in FIG. 1J.

In some embodiments, an underfill material 152 is formed to surround and protect the conductive connectors 148, in accordance with some embodiments. The material and formation method of the underfill material 152 in FIG. 4J may be the same as or similar to those of the underfill material 130 in FIG. 1F.

The redistribution structure 121 and the package substrate 144 may have a greater thermal expansion difference. As more and more chip structures are designed to be placed over the redistribution structure 121, the redistribution structure 121 is correspondingly formed to have a large area to receive these chip structures. As a result, the risk of warpage is further increased after bonding with the package substrate 144, which may negatively affect the reliability and performance of the package structure. Due to the carrier substrate 100 having high strength and a low coefficient of thermal expansion, the thermal expansion difference between the package substrate 144 and the elements above the carrier substrate 100 may be limited. The risk of warpage is significantly reduced or prevented. Therefore, the reliability and performance of the package structure are greatly improved.

Figure 5:
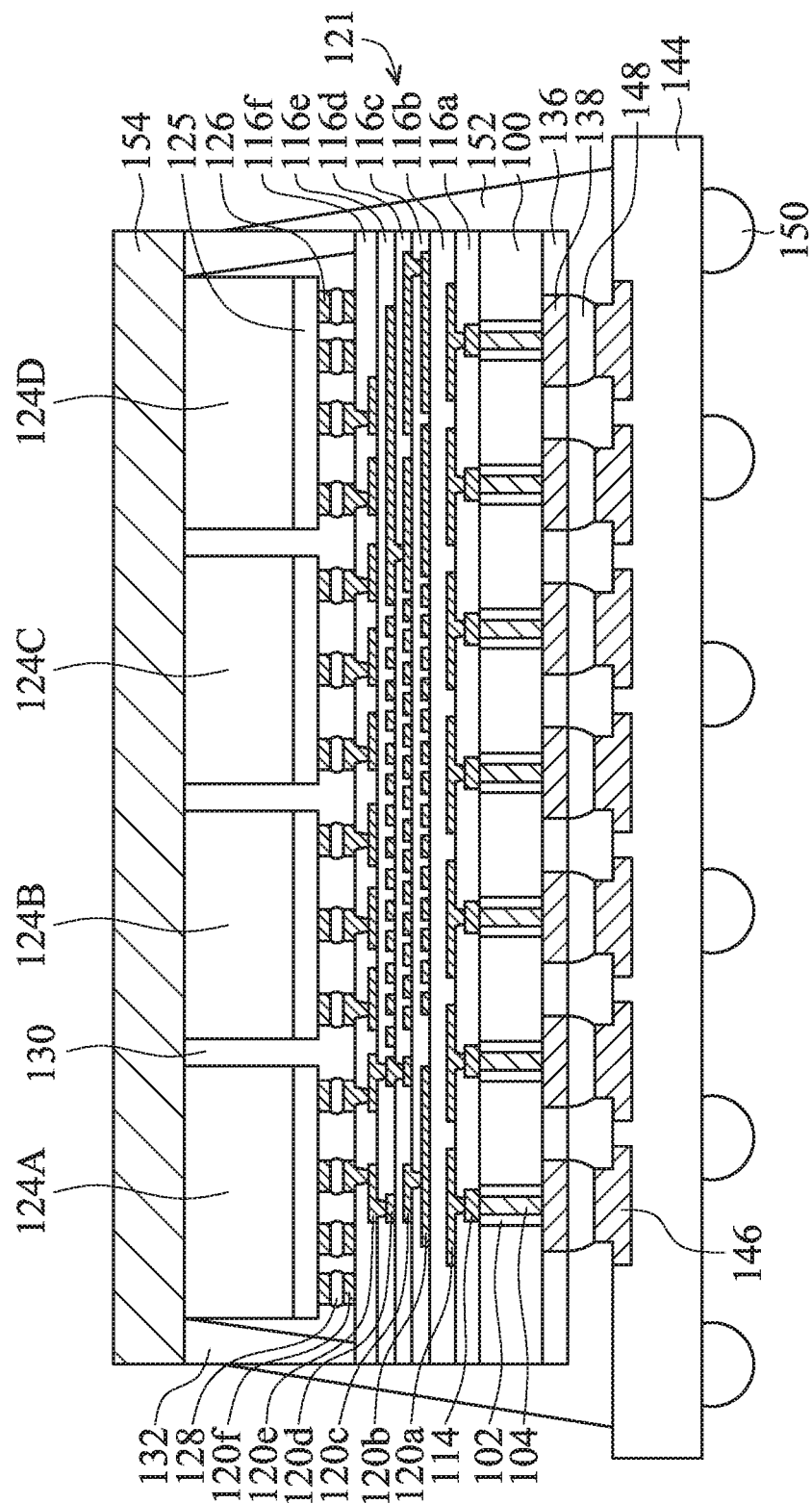
FIG. 5 is a cross-sectional view of a portion of a package structure, in accordance with some embodiments.

Many variations and/or modifications can be made to embodiments of the disclosure. FIG. 5 is a cross-sectional view of a portion of a package structure, in accordance with some embodiments. In some embodiments, a package structure similar to the structure shown in FIG. 4J is formed. Similar to the embodiments shown in FIG. 3, a thermal conductive structure 154 is formed over the chip structures

124A-124D, as shown in FIG. 5 in accordance with some embodiments. The thermal conductive structure 154 may be made of or include copper, aluminum, gold, one or more other suitable materials, or a combination thereof. In some embodiments, the thermal conductive structure 154 is in physical contact with the chip structures 124A-124D. In some other embodiments, a thermal conductive glue may be used to attach the thermal conductive structure 154 to the chip structures 124A-124D. Due to the thermal conductive structure 154, the heat dissipation of the chip structures 124A-124D may be improved, which would improve the performance and reliability of the package structure.

Many variations and/or modifications can be made to embodiments of the disclosure. In some embodiments, two or more redistribution structures are formed over opposite surfaces of the carrier substrate.

Figure 6A:
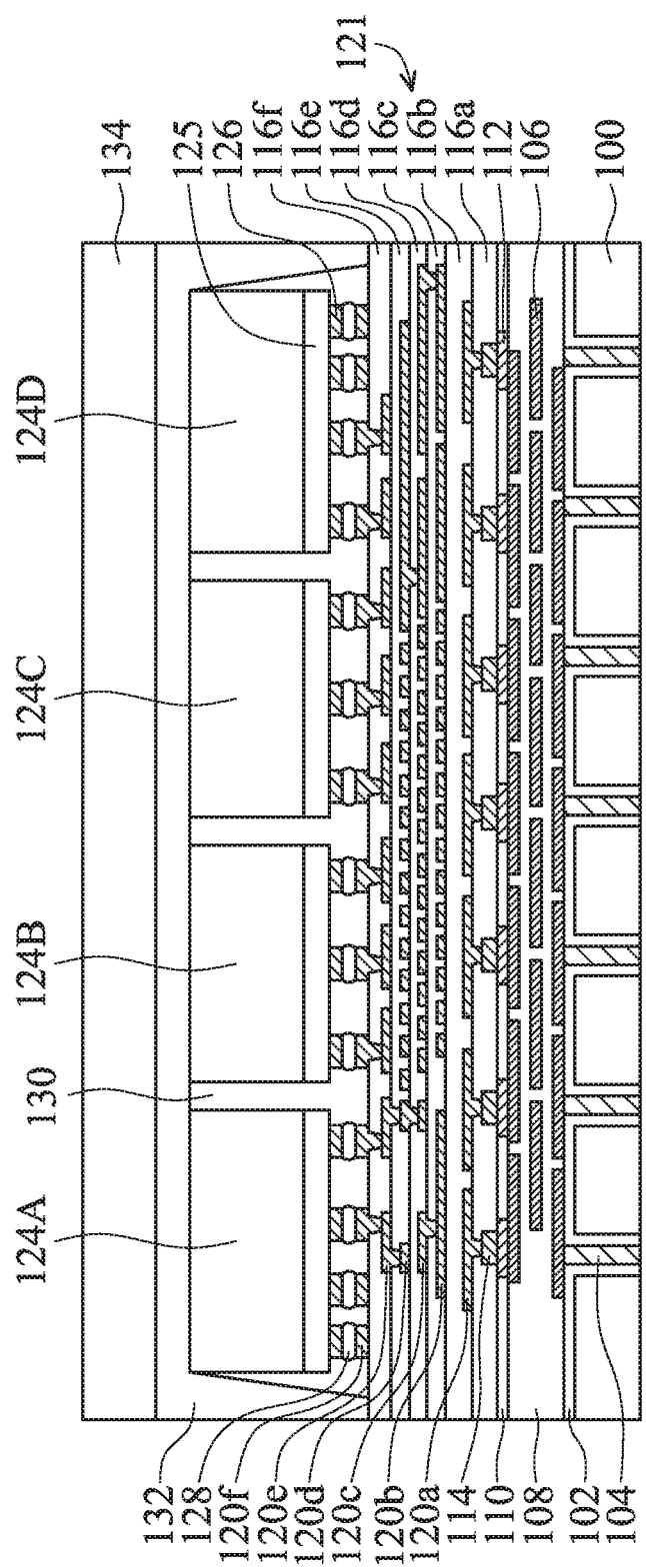
FIGS. 6A-6E are cross-sectional views of various stages of a process for forming a portion of a package structure, in accordance with some embodiments.

FIGS. 6A-6E are cross-sectional views of various stages of a process for forming a portion of a package structure, in accordance with some embodiments. As shown in FIG. 6A, a structure the same as or similar to that shown in FIG. 1G or 4G is formed, in accordance with some embodiments.

Figure 6B:
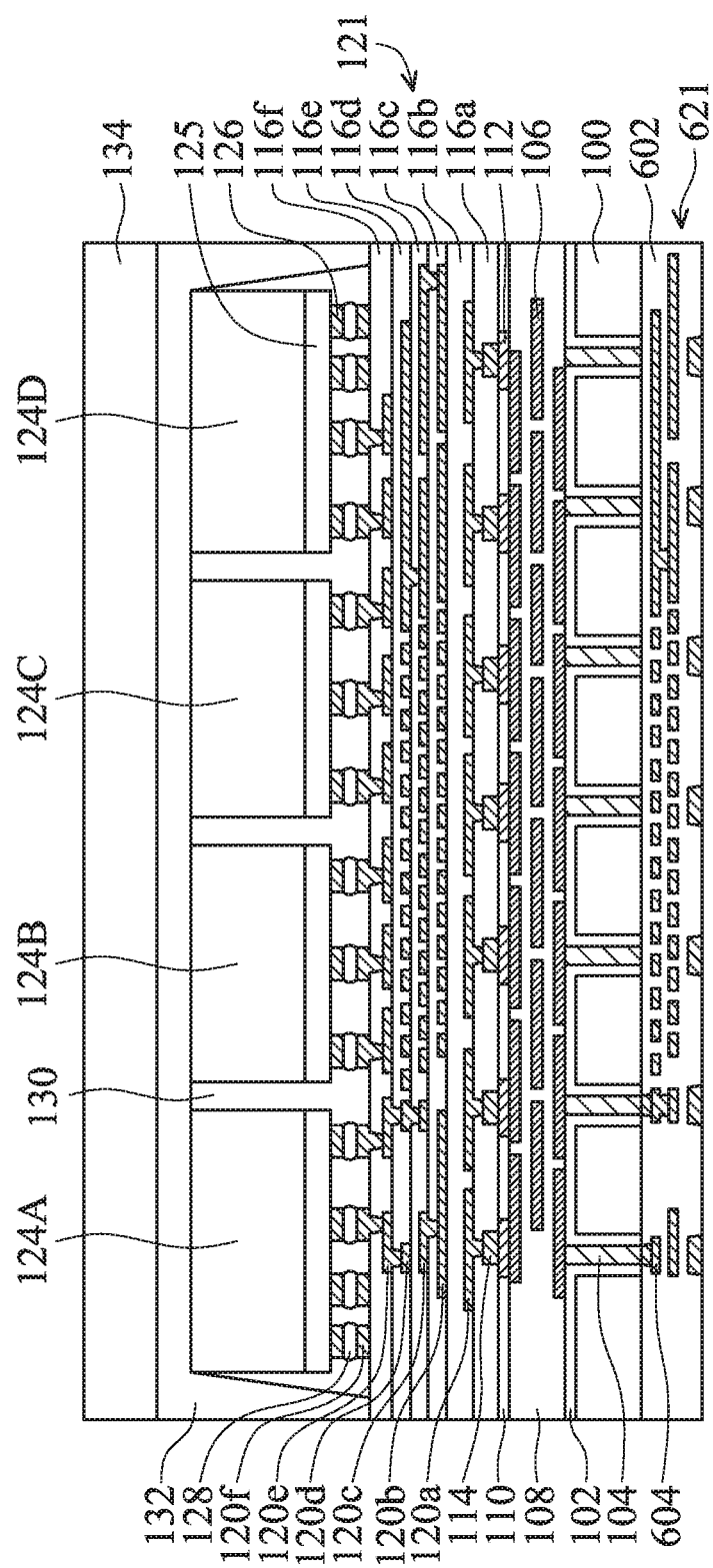

As shown in FIG. 6B, a second redistribution structure 621 is formed over the carrier substrate 100, in accordance with some embodiments. As a result, the carrier substrate 100 is between the redistribution structure 121 and the second redistribution structure 621. Similar to the redistribution structure 121, the second redistribution structure 621 includes multiple insulating layers 602 and multiple conductive features 604. The material and formation method of the second redistribution structure 621 may be the same as or similar to those of the redistribution structure 121.

As shown in FIG. 6B, some conductive features in the redistribution structure 121 are conductive vias. In some embodiments, the upper portion of the conductive via is wider than the lower portion of the conductive via, as shown in FIG. 6B. As shown in FIG. 6B, some conductive features in the second redistribution structure 621 are conductive vias. In some embodiments, in the second redistribution structure 621, the lower portion of the conductive via is wider than the upper portion of the conductive via, as shown in FIG. 6B.

Figure 6C:
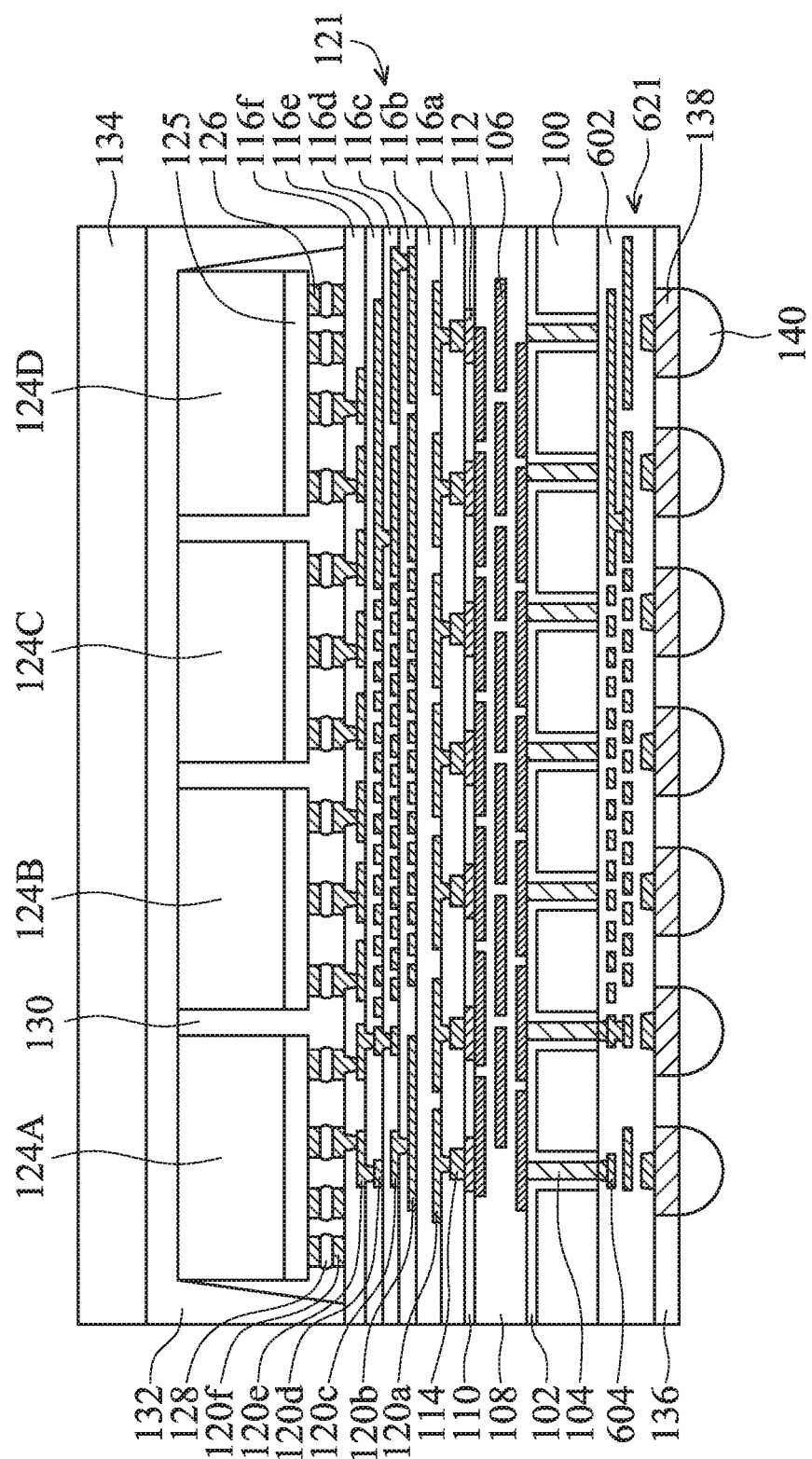

As shown in FIG. 6C, a protective layer 136, conductive pads 138, and conductive connectors 140 are formed, in accordance with some embodiments. The material and formation method of the protective layer 136, the conductive pads 138, and the conductive connectors 140 in FIG. 6C may be the same as or similar to those of the protective layer 136, conductive pads 138, and conductive connectors 140 in FIG. 1H.

Figure 6D:
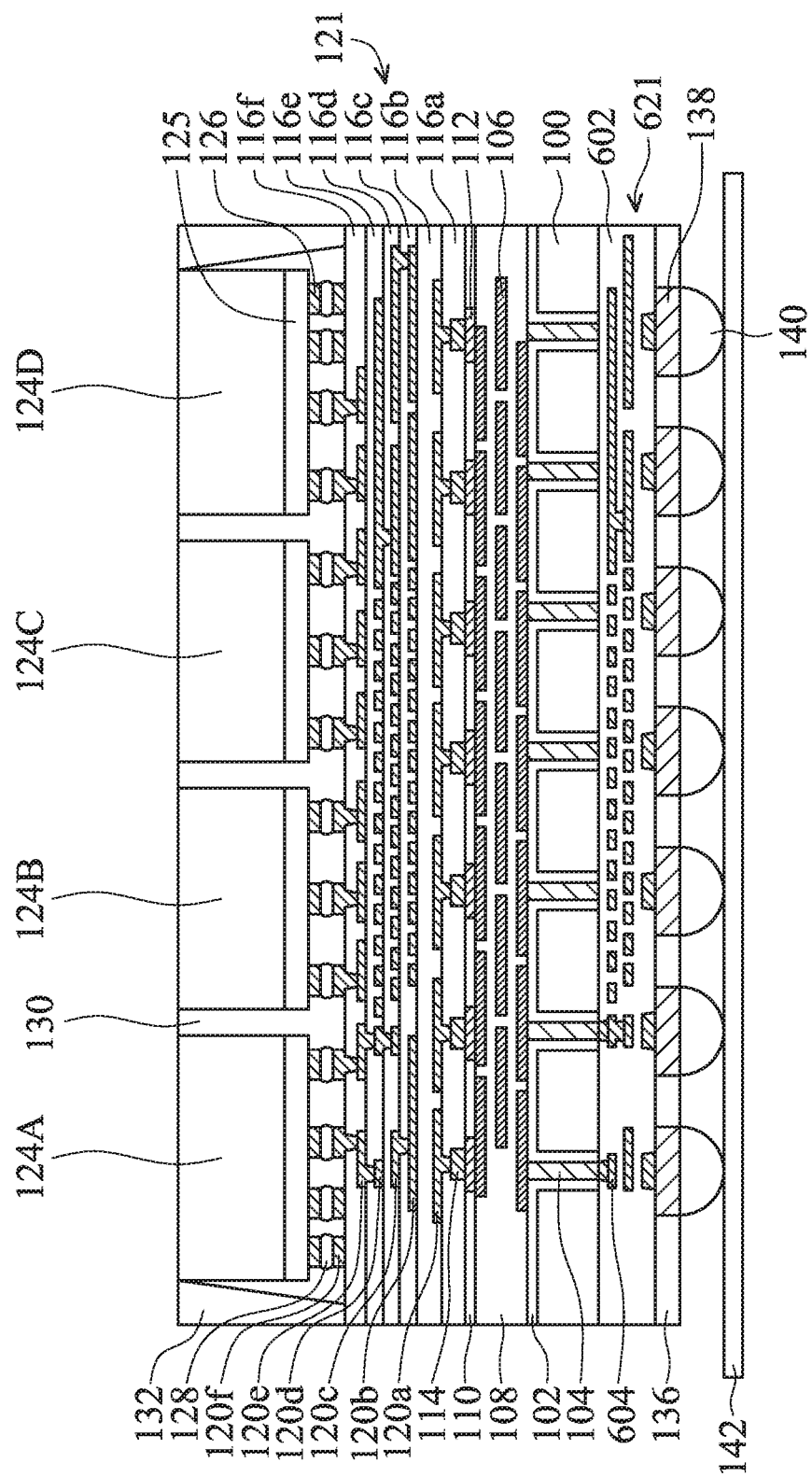

As shown in FIG. 6D, the structure in FIG. 6C is attached onto a carrier tape 142, in accordance with some embodiments. Afterwards, the temporary support substrate 134 is removed, and the protective layer 132 is further thinned to expose one or more of the chip structures 124A-124D, as shown in FIG. 6D in accordance with some embodiments. In some embodiments, each of the chip structures 124A-124D is exposed after the thinning of the protective layer 132.

In some embodiments, a sawing process is used to cut through the structure shown in FIG. 6D into multiple separate package structures. These package structures may then be integrated into other larger package structures.

However, embodiments of the disclosure are not limited thereto. Many variations and/or modifications can be made to embodiments of the disclosure. In some other embodiments, the sawing process is not performed to separate the structure in FIG. 6D into multiple smaller package structures. The entirety of the wafer-level package structure may then be integrated into a large package structure.

Figure 6E:
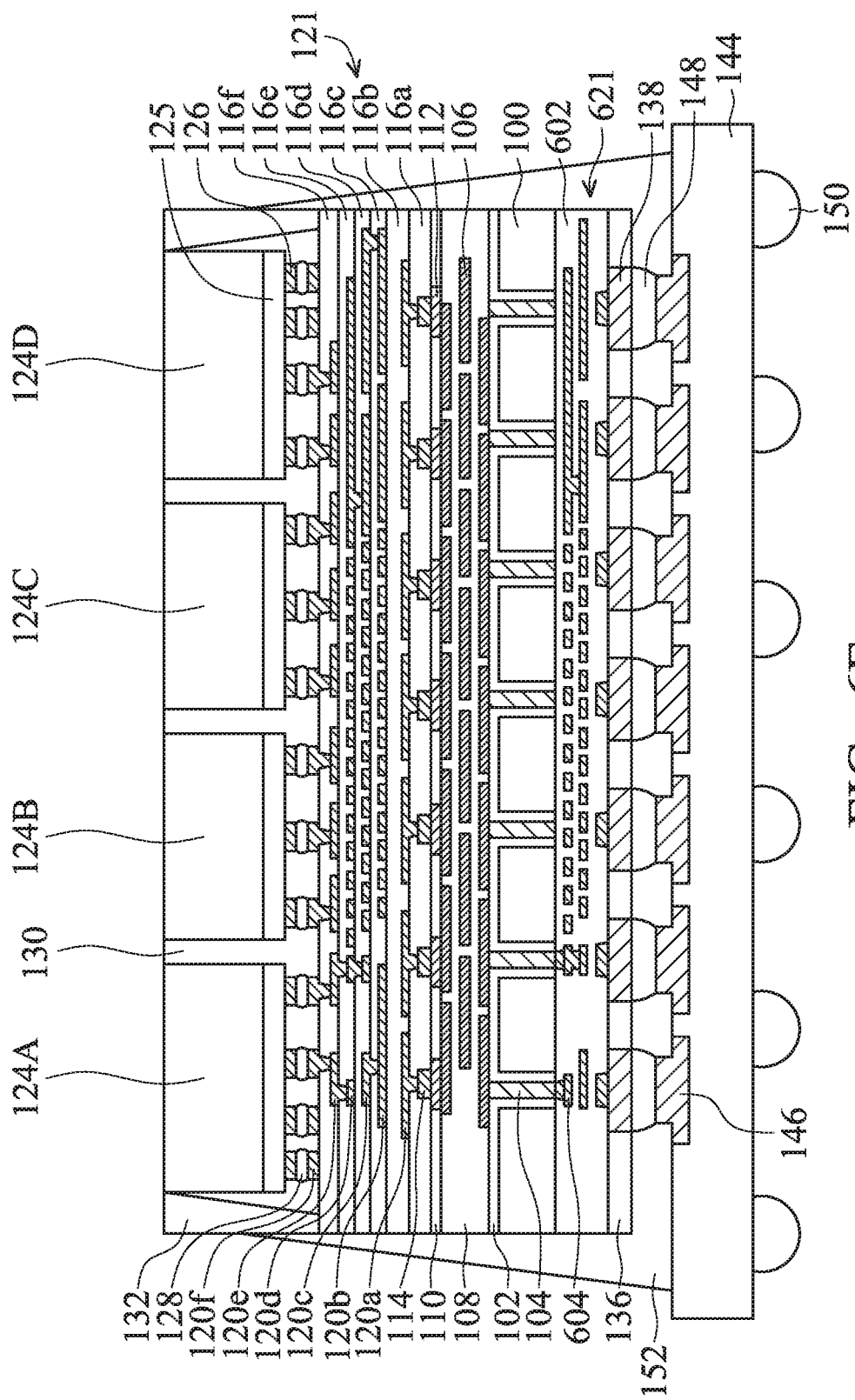

As shown in FIG. 6E, the package structure shown in FIG. 6D is picked from the carrier tape 142 and placed over a package substrate 144, in accordance with some embodiments. The package substrate 144 in FIG. 6E may be the same as or similar to the package substrate 144 in FIG. 1J. In some embodiments, the package structure shown in FIG. 6D is bonded to the package substrate 144 through conductive connectors 148. The material and formation method of the conductive connectors 148 in FIG. 6E may be the same as or similar to those of the conductive connectors 148 in FIG. 1J.

In some embodiments, an underfill material 152 is formed to surround and protect the conductive connectors 148, in accordance with some embodiments. The material and formation method of the underfill material 152 may be the same as or similar to those of the underfill material 130 in FIG. 1F.

Figure 7:
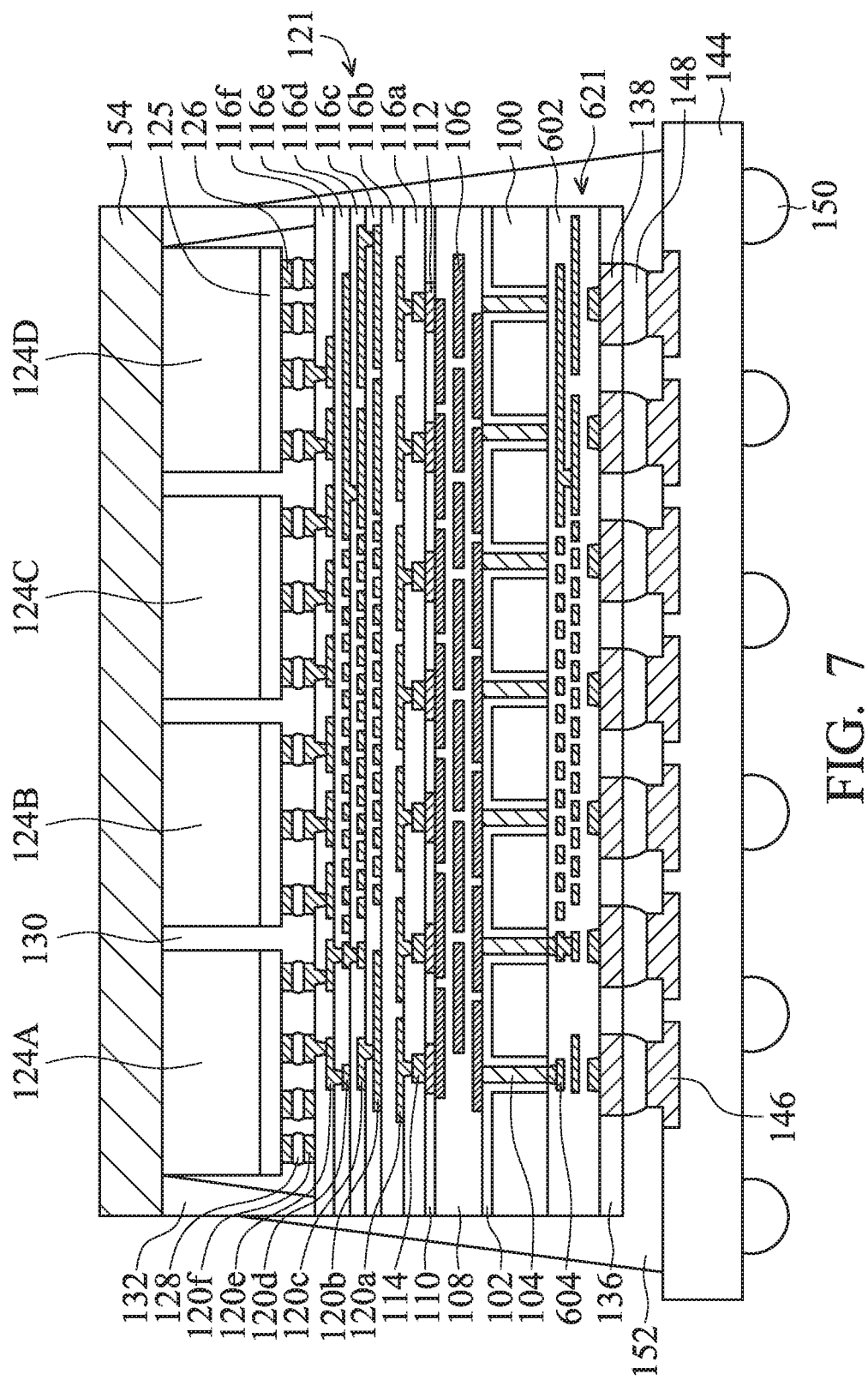
FIG. 7 is a cross-sectional view of a portion of a package structure, in accordance with some embodiments.

Many variations and/or modifications can be made to embodiments of the disclosure. FIG. 7 is a cross-sectional view of a portion of a package structure, in accordance with some embodiments. In some embodiments, a package structure similar to the structure shown in FIG. 6E is formed. Similar to the embodiments shown in FIG. 3, a thermal conductive structure 154 is formed over the chip structures 124A-124D, as shown in FIG. 7 in accordance with some embodiments. The thermal conductive structure 154 may be made of or include copper, aluminum, gold, one or more other suitable materials, or a combination thereof. In some embodiments, the thermal conductive structure 154 is in physical contact with the chip structures 124A-124D. In some other embodiments, a thermal conductive glue may be used to attach the thermal conductive structure 154 to the chip structures 124A-124D. Due to the thermal conductive structure 154, the heat dissipation of the chip structures 124A-124D may be improved, which facilitates the performance and reliability of the package structure.

Figure 8:
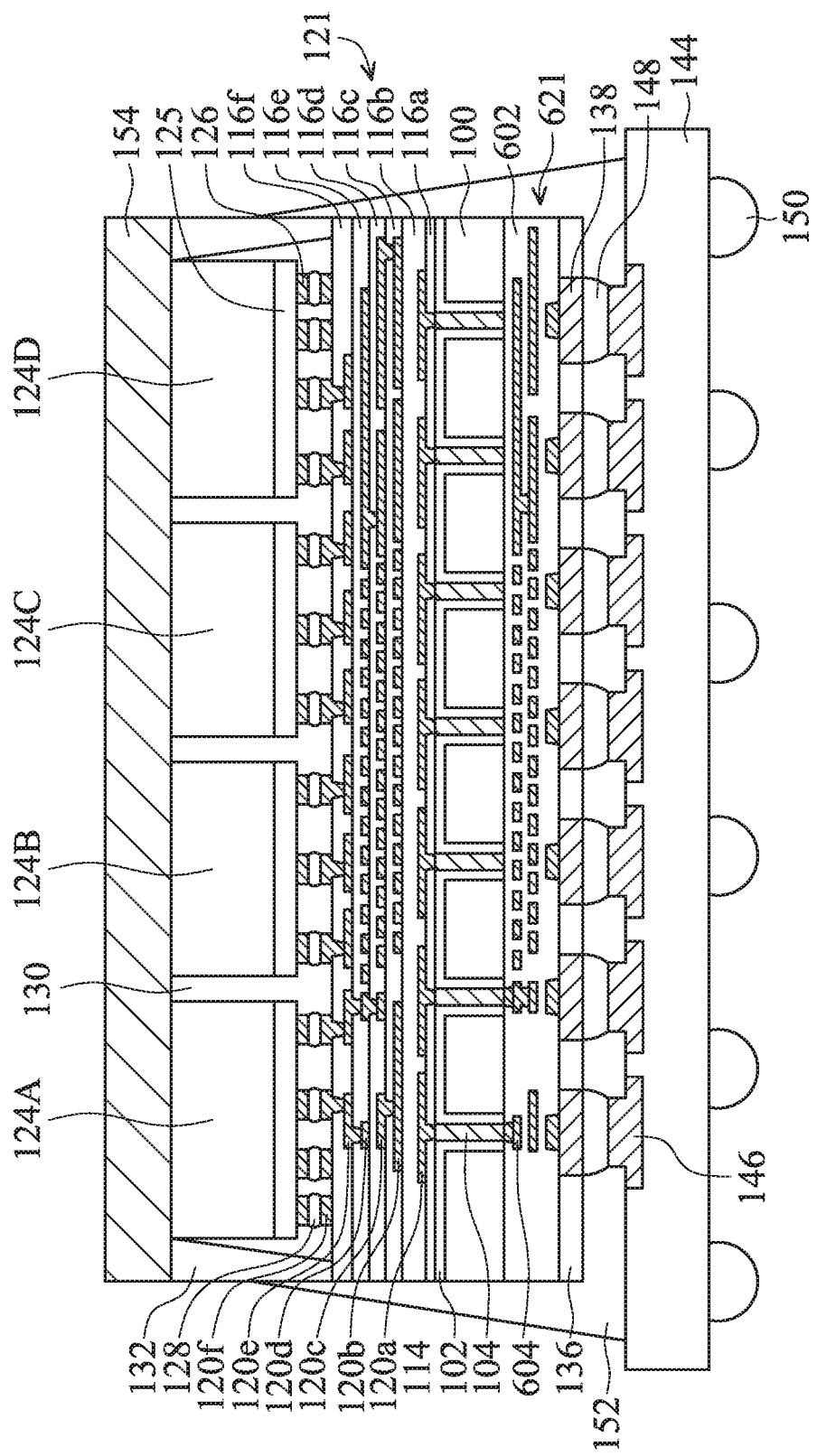
FIG. 8 is a cross-sectional view of a portion of a package structure, in accordance with some embodiments.

Many variations and/or modifications can be made to embodiments of the disclosure. FIG. 8 is a cross-sectional view of a portion of a package structure, in accordance with some embodiments. In some embodiments, a package structure similar to the structure shown in FIG. 7 is formed. Unlike the embodiments illustrated in FIG. 7, the elements 106, 108, 110, and 112 are not formed in the embodiments illustrated in FIG. 8.

Many variations and/or modifications can be made to embodiments of the disclosure. In some embodiments, the carrier substrate is made of an insulating material such as glass. The dielectric layer 102 may not need to be formed along the sidewalls and bottoms of the conductive structures 104.

Figure 9C:
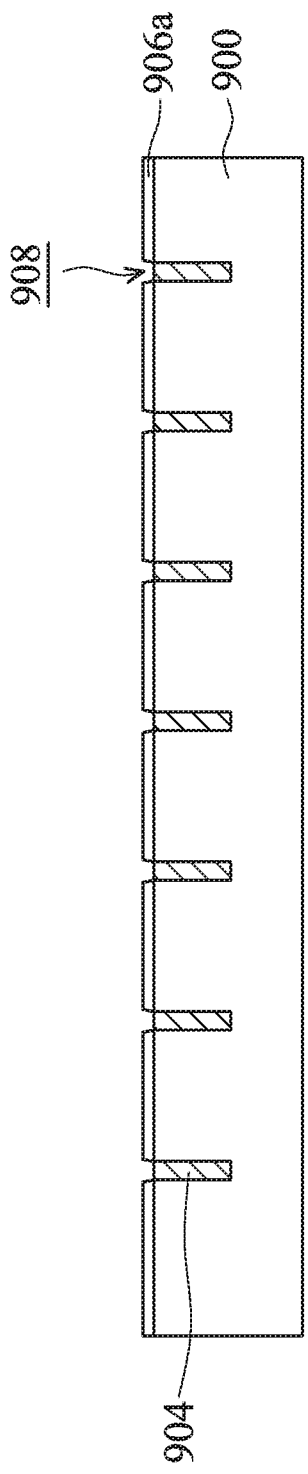

FIGS. 9A-9K are cross-sectional views of various stages of a process for forming a portion of a package structure, in accordance with some embodiments. As shown in FIG. 9A, a carrier substrate 900 is received or provided. In some embodiments, the carrier substrate 900 is a dielectric substrate, such as a glass wafer. The carrier substrate 900 may be made of or include silicon oxide, aluminum oxide, titanium oxide, one or more other suitable materials, or a combination thereof. In some embodiments, the main body of the carrier substrate 900 is a single layer structure.

As shown in FIG. 9A, the carrier substrate 900 is partially removed to form openings 902, in accordance with some embodiments. The openings 902 may be formed using an energy beam drilling process, a mechanical drilling process, photolithography and etching processes, one or more other applicable processes, or a combination thereof. The energy beam drilling process may include a laser beam drilling process, an electron beam drilling process, an ion beam drilling process, a plasma beam drilling process, the like, or a combination thereof.

As shown in FIG. 9B, similar to the embodiments illustrated in FIG. 1A, conductive structures 904 are formed, in accordance with some embodiments. In some embodiments, since the dielectric layer 102 is not formed, the conductive structures 904 fill the openings 902 and are in physical contact with the carrier substrate 900. The material and formation method of the conductive structures 904 may be the same as or similar to the conductive structures 104 in FIG. 1A. In some embodiments, the conductive structures 904 slightly protrude from the top surface of the carrier substrate 900. In some other embodiments, the top ends of the conductive structures 904 are substantially level with the top surface of the carrier substrate 900.

As shown in FIG. 9C, an insulating layer 906a with multiple openings 908 is formed over the carrier substrate 900, in accordance with some embodiments. The openings 908 expose the conductive structures 904. In some embodiments, the insulating layer 906a is in physical contact with the carrier substrate 900. The material and formation method of the insulating layer 906a may be the same as or similar to those of the insulating layer 116a in FIG. 1B.

Figure 9D:
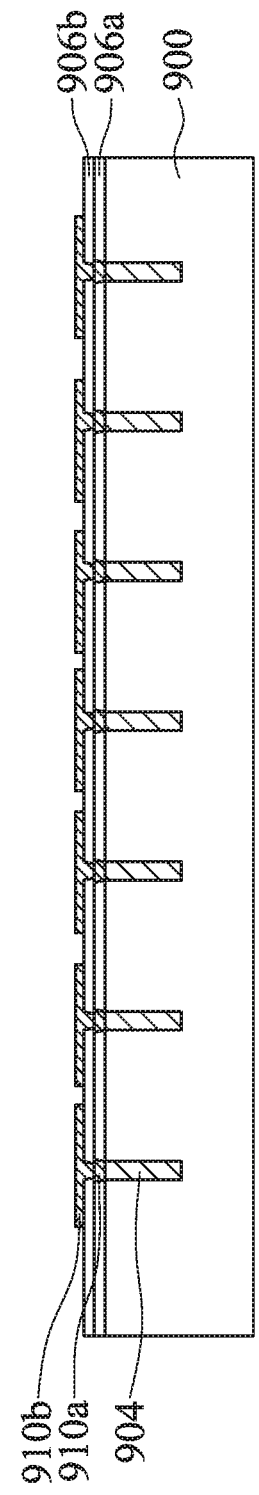

As shown in FIG. 9D, conductive features 910a and 910b and an insulating layer 906b are formed, in accordance with some embodiments. The conductive features 910a may function as conductive pads that form electrical connection to the conductive structures 904 in the carrier substrate 900. The material and formation method of the conductive features 910a and 910b in FIG. 9D may be the same as or similar to those of the conductive features 120a in FIG. 1C. The material and formation method of the insulating layer 906b may be the same as or similar to those of the insulating layer 906a.

Figure 9E:
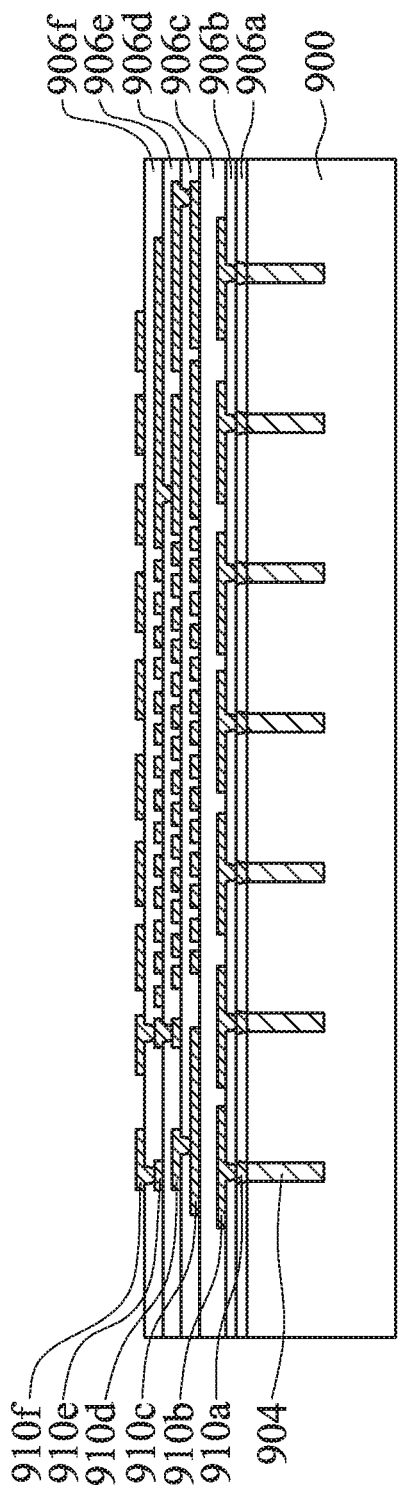

As shown in FIG. 9E, multiple insulating layers 906c-906f and multiple conductive features 910c-910f are formed, in accordance with some embodiments. The material and formation method of the insulating layers 906c-906f may be the same as or similar to those of the insulating layer 116a in FIG. 1B. The material and formation method of the conductive features 910c-910f may be the same as or similar to those of the conductive features 120a in FIG. 1C.

Figure 9F:
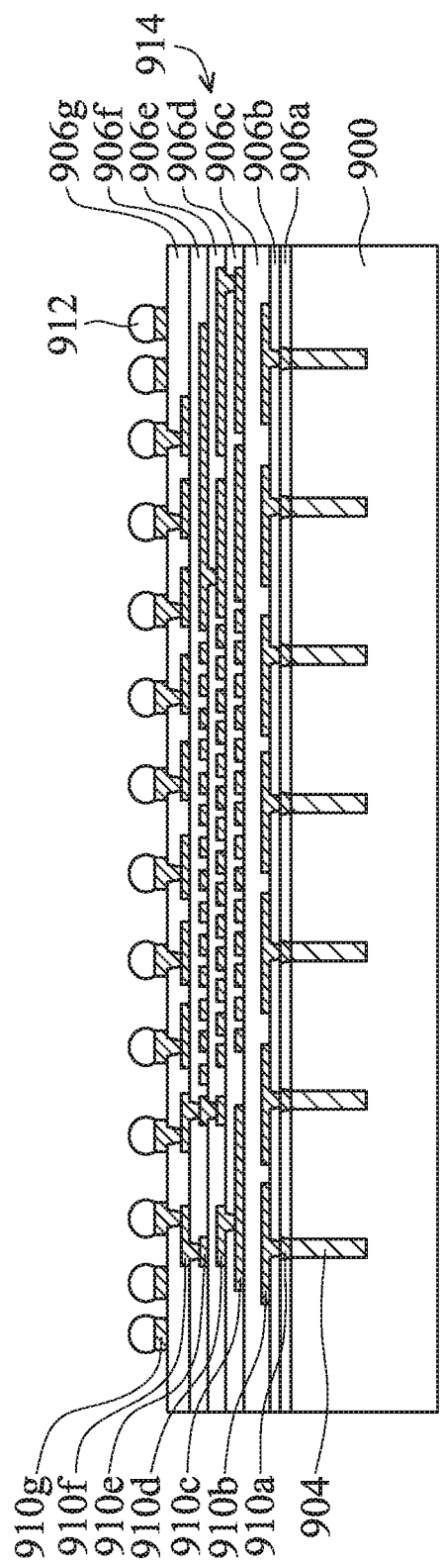

As shown in FIG. 9F, an insulating layer 906g and conductive features 910g are formed, in accordance with some embodiments. The insulating layers 906a-906g and the conductive features 910a-910g together form a redistribution structure 914. The insulating layer 906g may function as a topmost insulating layer of the redistribution structure 914. The conductive features 910g may function as conductive pads and/or conductive pillars of the redistribution structure 914. For example, the conductive features 910g are used as under bump metallization (UBM) pads. The material and formation method of the insulating layer 906g may be the same as or similar to those of the insulating layer 116a in FIG. 1B. The material and formation method of the conductive features 910g may be the same as or similar to those of the conductive features 120a in FIG. 1C.

As shown in FIG. 9F, conductive connectors 912 are formed over the conductive features 910g, in accordance with some embodiments. The material and formation method of the conductive connectors 912 in FIG. 9F may be the same as or similar to those of the conductive connectors 122 in FIG. 1E.

Figure 9G:
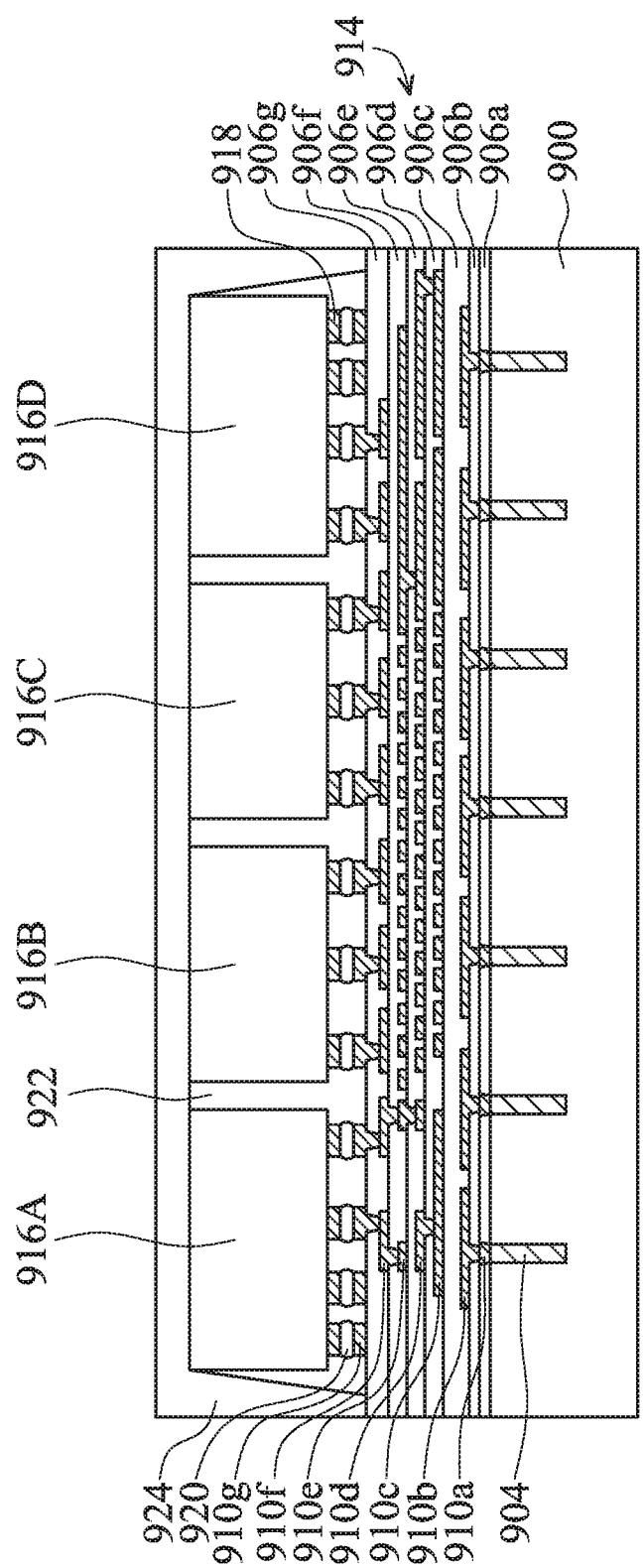

As shown in FIG. 9G, similar to the embodiments shown in FIG. 1F, multiple chip structures including chip structures 916A, 916B, 916C, and 916D are disposed over the redistribution structure 914 formed over the carrier substrate 900, in accordance with some embodiments. Similar to the chip structures 124A-124D in FIG. 1F, the chip structures 916A-916D in FIG. 9G may be semiconductor dies and/or packages including one or more semiconductor dies that are encapsulated or protected.

In some embodiments, the chip structures 916A-916D are bonded onto the conductive features 910g of the redistribution structure 914 through conductive connectors 920. In some embodiments, each of the chip structures 916A-916D includes conductive pillars 918 with solder elements formed thereon. The chip structures 916A-916D are picked and placed onto the redistribution structure 914. In some embodiments, the solder elements of the chip structures 916A-916D and the conductive connectors 912 are reflowed together. As a result, the conductive connectors 920 are formed. The chip structures 916A-916D and the redistribution structure 914 are bonded together through the conductive connectors 920.

As shown in FIG. 9G, an underfill material 922 is formed to surround and protect the conductive connectors 920, in accordance with some embodiments. The material and formation method of the underfill material 922 may be the same as or similar to those of the underfill material 130 in FIG. 1F.

As shown in FIG. 9G, a protective layer 924 is formed over the redistribution structure 914 to surround and protect the chip structures 916A-916D, in accordance with some embodiments. The material and formation method of the protective layer 924 may be the same as or similar to those of the protective layer 132 in FIG. 1F.

Figure 9H:
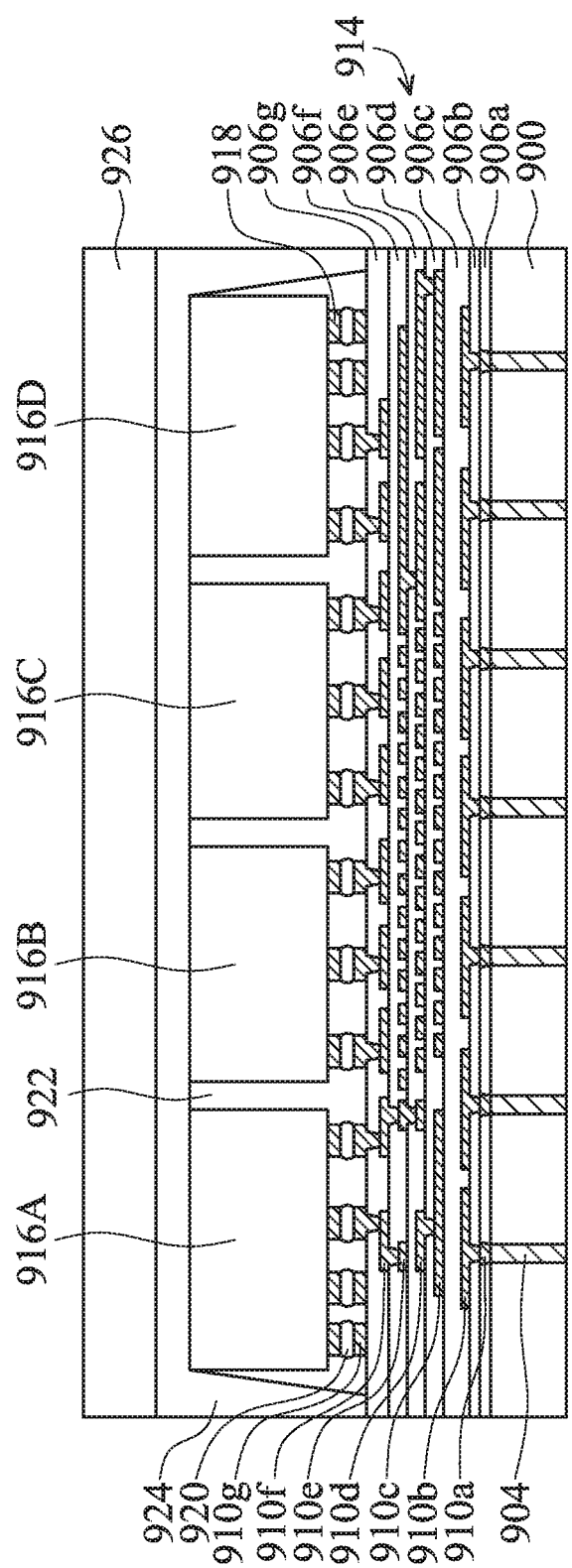

As shown in FIG. 9H, similar to the embodiments illustrated in FIG. 1G, a temporary support substrate 926 is attached to the protective layer 924, in accordance with some embodiments. The material of the temporary support substrate 926 may be the same as or similar to that of the temporary support substrate 134 in FIG. 1G.

As shown in FIG. 9H, similar to the embodiments illustrated in FIG. 1G, the carrier substrate 900 is partially removed to expose the conductive structures 904, in accordance with some embodiments. The conductive structures 904 may penetrate through the carrier substrate 900 after the carrier substrate 900 is partially removed. In some embodiments, the conductive structures 904 slightly protrude below the bottom surface of the carrier substrate 900. In some other embodiments, the bottom ends of the conductive structures 904 are substantially level with the bottom surface of the carrier substrate 900. In some embodiments, a thinning process is used to partially remove the carrier substrate 900. The thinned carrier substrate 900 may function as a reinforced plate that enhances the strength of the package structure, so as to prevent and/or reduce warpage of the package structure. The reliability and performance of the package structure are improved.

Figure 9I:
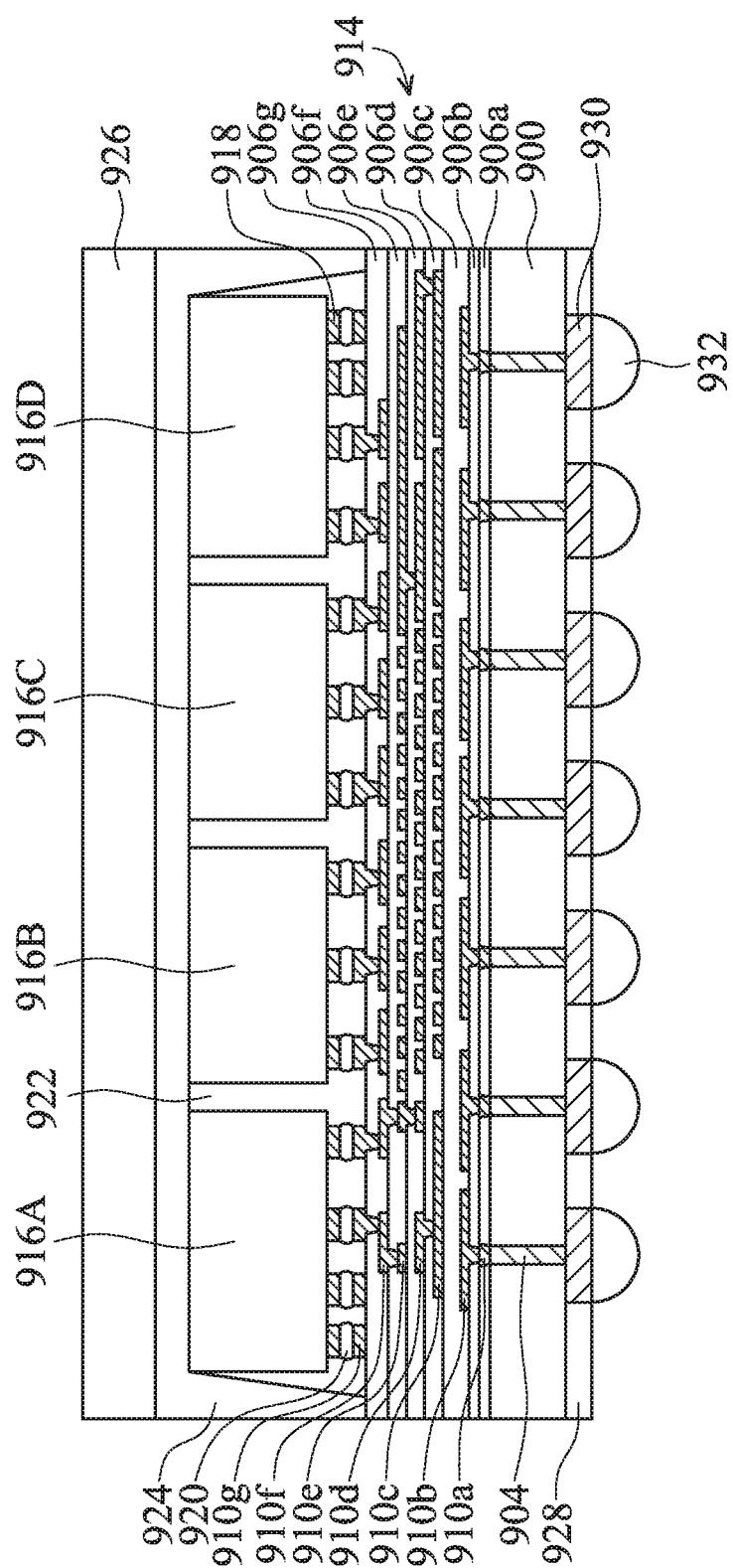

As shown in FIG. 9I, a protective layer 928, conductive pads 930, and conductive connectors 932 are formed, in accordance with some embodiments. The material and formation method of the protective layer 928, the conductive pads 930, and the conductive connectors 932 may be the same as or similar to those of the protective layer 136, conductive pads 138, and conductive connectors 140 in FIG. 1H.

Figure 9J:
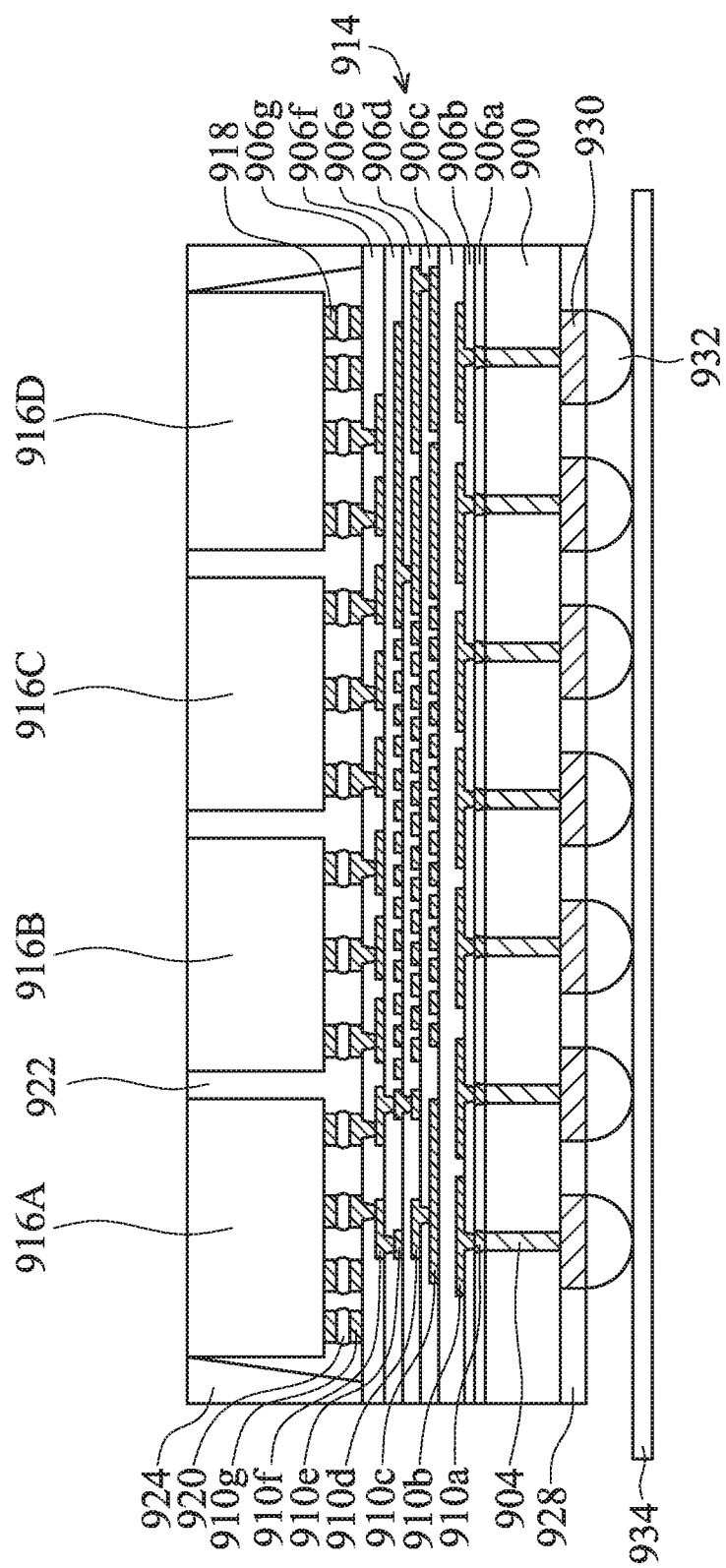

As shown in FIG. 9J, the structure in FIG. 9I is attached onto a carrier tape 934, in accordance with some embodiments. Afterwards, the temporary support substrate 926 is removed, and the protective layer 924 is further thinned to expose one or more of the chip structures 916A-916D, as shown in FIG. 9J in accordance with some embodiments. In some embodiments, each of the chip structures 916A-916D is exposed after the thinning of the protective layer 924.

In some embodiments, a sawing process is used to cut through the structure shown in FIG. 9J into multiple separate package structures. These package structures may then be integrated into other larger package structures.

However, embodiments of the disclosure are not limited thereto. Many variations and/or modifications can be made to embodiments of the disclosure. In some other embodiments, the sawing process is not performed to separate the structure in FIG. 9J into multiple smaller package structures. The entirety of the wafer-level package structure may then be integrated into a large package structure.

Figure 9K:
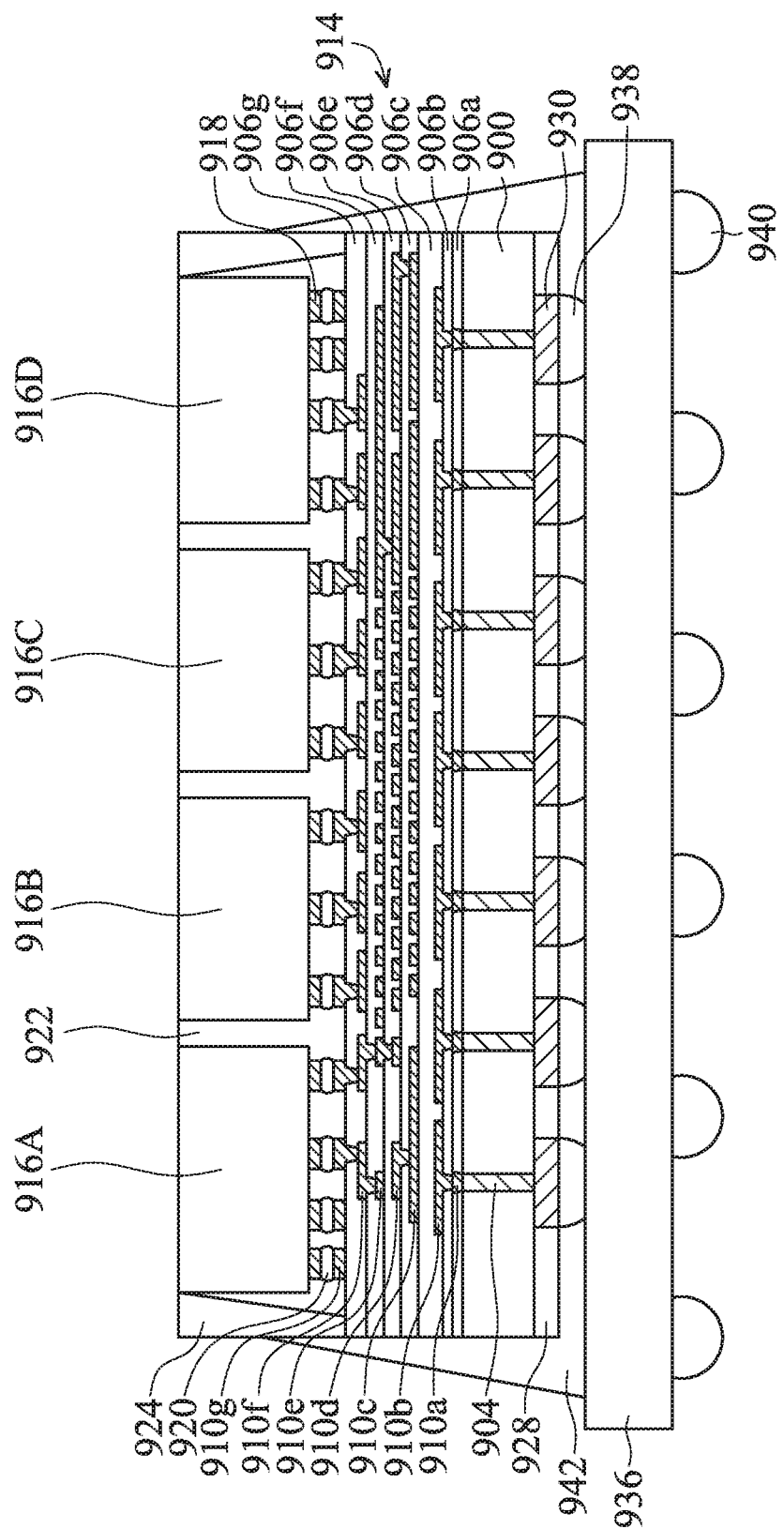

As shown in FIG. 9K, the package structure shown in FIG. 9J is picked from the carrier tape 934 and placed over a package substrate 936, in accordance with some embodiments. The package substrate 936 may be the same as or similar to the package substrate 144 in FIG. 1J. The package substrate 936 further includes multiple conductive bumps 940. The conductive bumps 940 may be used to connect another element such as a circuit board. In some embodiments, the package structure shown in FIG. 9J is bonded to the package substrate 936 through conductive connectors 938. The material and formation method of the conductive connectors 938 may be the same as or similar to those of the conductive connectors 148 in FIG. 1J.

In some embodiments, an underfill material 942 is formed to surround and protect the conductive connectors 938, in accordance with some embodiments. The material and formation method of the underfill material 942 may be the same as or similar to those of the underfill material 130 in FIG. 1F.

The redistribution structure 914 and the package substrate 936 may have a greater thermal expansion difference. As more and more chip structures are designed to be placed over the redistribution structure 914, the redistribution structure 914 is correspondingly formed to have a large area to receive these chip structures. As a result, the risk of warpage is further increased after bonding with the package substrate 936, which may negatively affect the reliability and performance of the package structure. Due to the carrier substrate 900 having high strength and a low coefficient of thermal expansion, the thermal expansion difference between the package substrate 936 and the elements above the carrier substrate 900 may be limited. The risk of warpage is significantly reduced or prevented. Therefore, the reliability and performance of the package structure are greatly improved.

Figure 10:
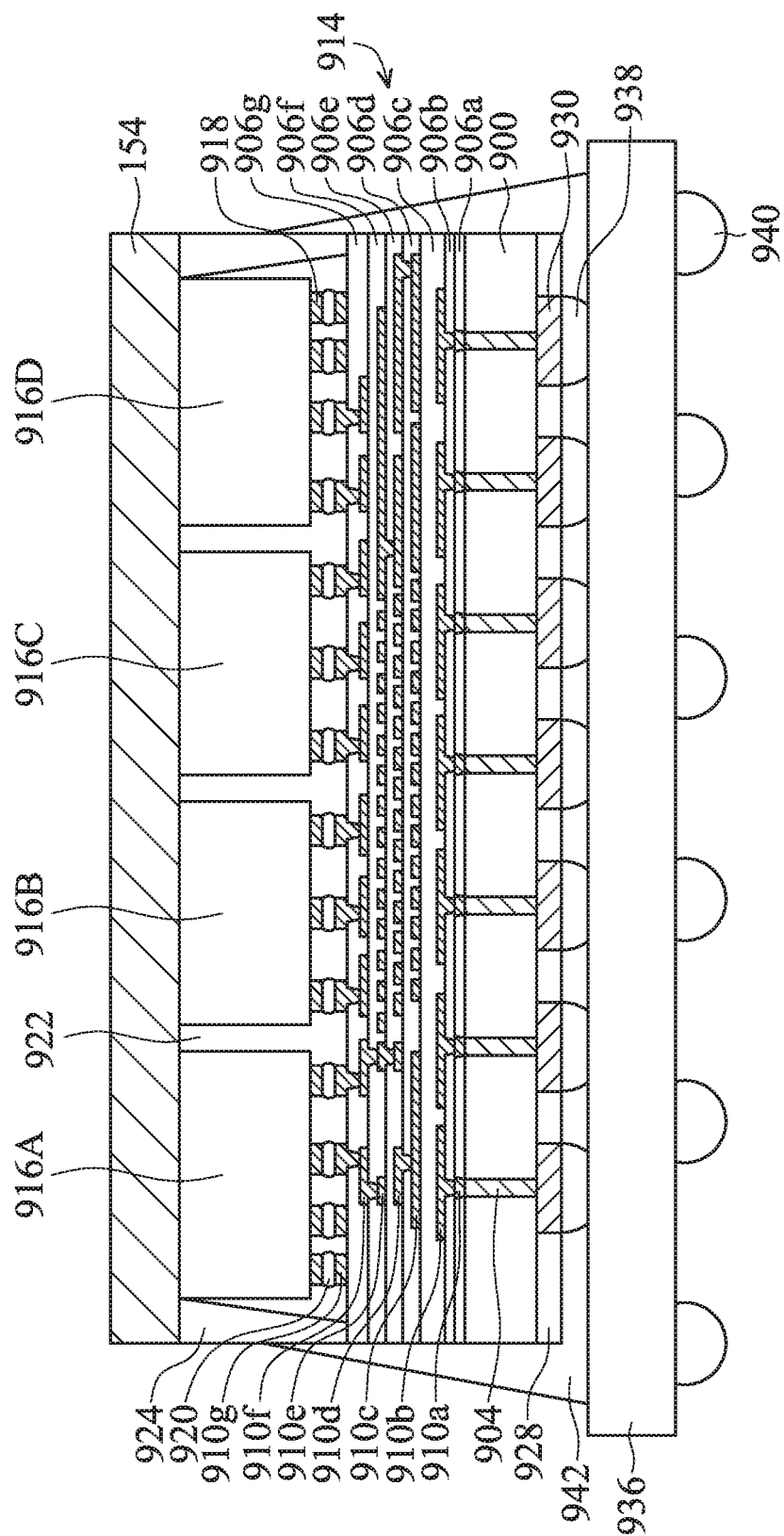
FIG. 10 is a cross-sectional view of a portion of a package structure, in accordance with some embodiments.

Many variations and/or modifications can be made to embodiments of the disclosure. FIG. 10 is a cross-sectional view of a portion of a package structure, in accordance with some embodiments. In some embodiments, a package structure similar to the structure shown in FIG. 9K is formed. Similar to the embodiments shown in FIG. 3, a thermal conductive structure 154 is formed over the chip structures 916A-916D, as shown in FIG. 10 in accordance with some embodiments. The thermal conductive structure 154 may be made of or include copper, aluminum, gold, one or more other suitable materials, or a combination thereof. In some embodiments, the thermal conductive structure 154 is in physical contact with the chip structures 916A-916D. In some other embodiments, a thermal conductive glue may be used to attach the thermal conductive structure 154 to the chip structures 916A-916D. Due to the thermal conductive structure 154, the heat dissipation of the chip structures 916A-916D may be improved, which would improve the performance and reliability of the package structure.

Many variations and/or modifications can be made to embodiments of the disclosure. In some embodiments, two or more redistribution structures are formed over opposite surfaces of the carrier substrate.

Figure 11A:
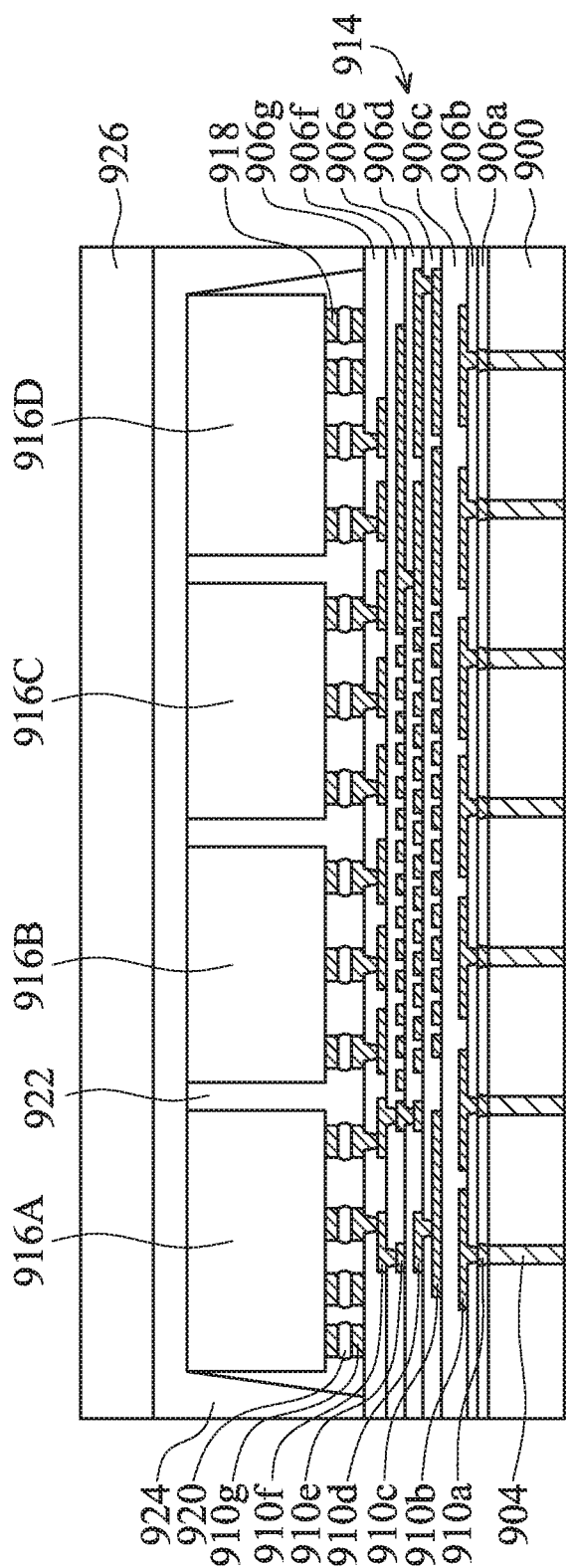
FIGS. 11A-11E are cross-sectional views of various stages of a process for forming a portion of a package structure, in accordance with some embodiments.

FIGS. 11A-11E are cross-sectional views of various stages of a process for forming a portion of a package structure, in accordance with some embodiments. As shown in FIG. 11A, a structure the same as or similar to that shown in FIG. 9H is formed, in accordance with some embodiments.

Figure 11B:
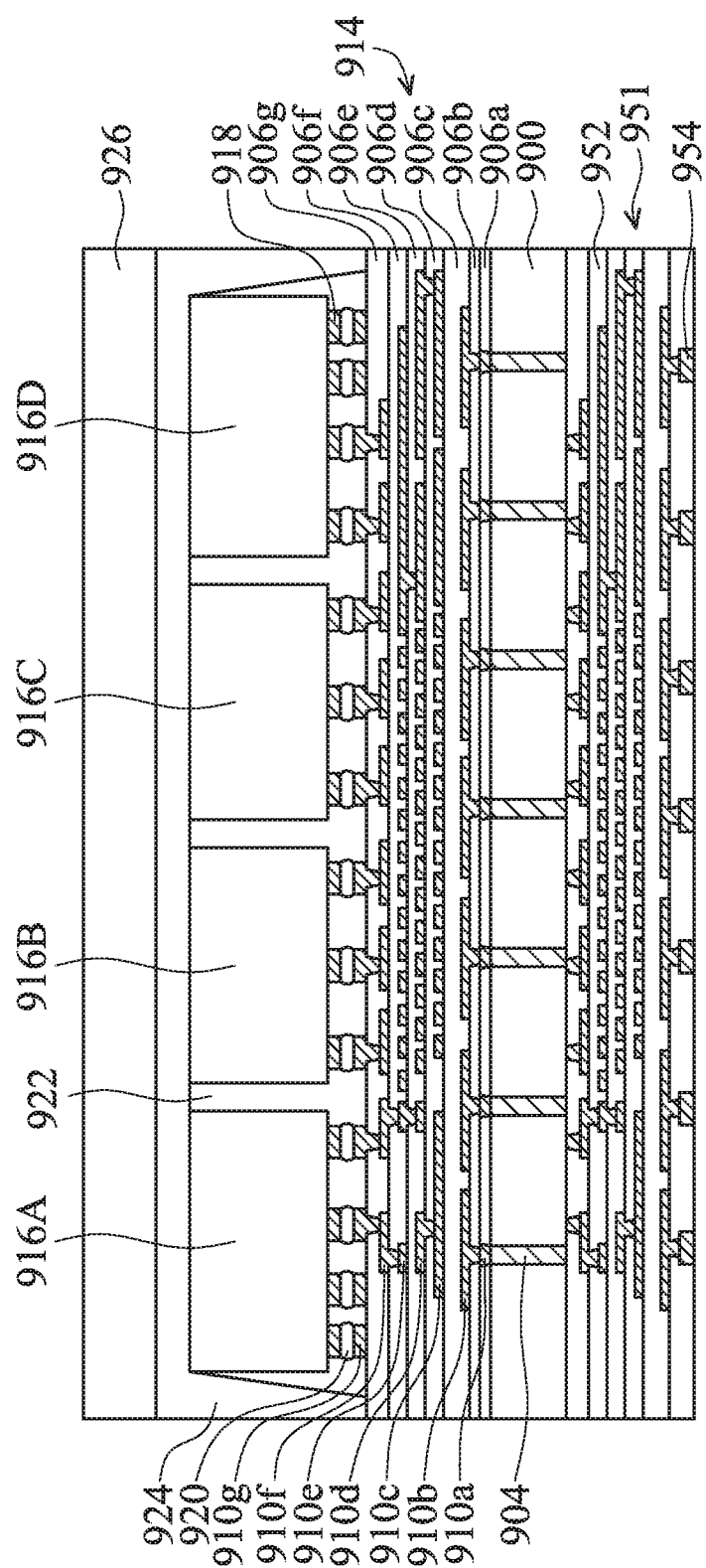

As shown in FIG. 11B, a second redistribution structure 951 is formed over the carrier substrate 900, in accordance with some embodiments. As a result, the carrier substrate 900 is between the redistribution structure 914 and the second redistribution structure 951. Similar to the redistribution structure 914, the second redistribution structure 951 includes multiple insulating layers 952 and multiple conductive features 954. The material and formation method of the second redistribution structure 951 may be the same as or similar to those of the redistribution structure 914.

As shown in FIG. 11B, some conductive features in the redistribution structure 914 are conductive vias. In some embodiments, the upper portion of the conductive via is wider than the lower portion of the conductive via, as shown in FIG. 11B. As shown in FIG. 11B, some conductive features in the second redistribution structure 951 are conductive vias. In some embodiments, in the second redistribution structure 951, the lower portion of the conductive via is wider than the upper portion of the conductive via, as shown in FIG. 11B.

Figure 11C:
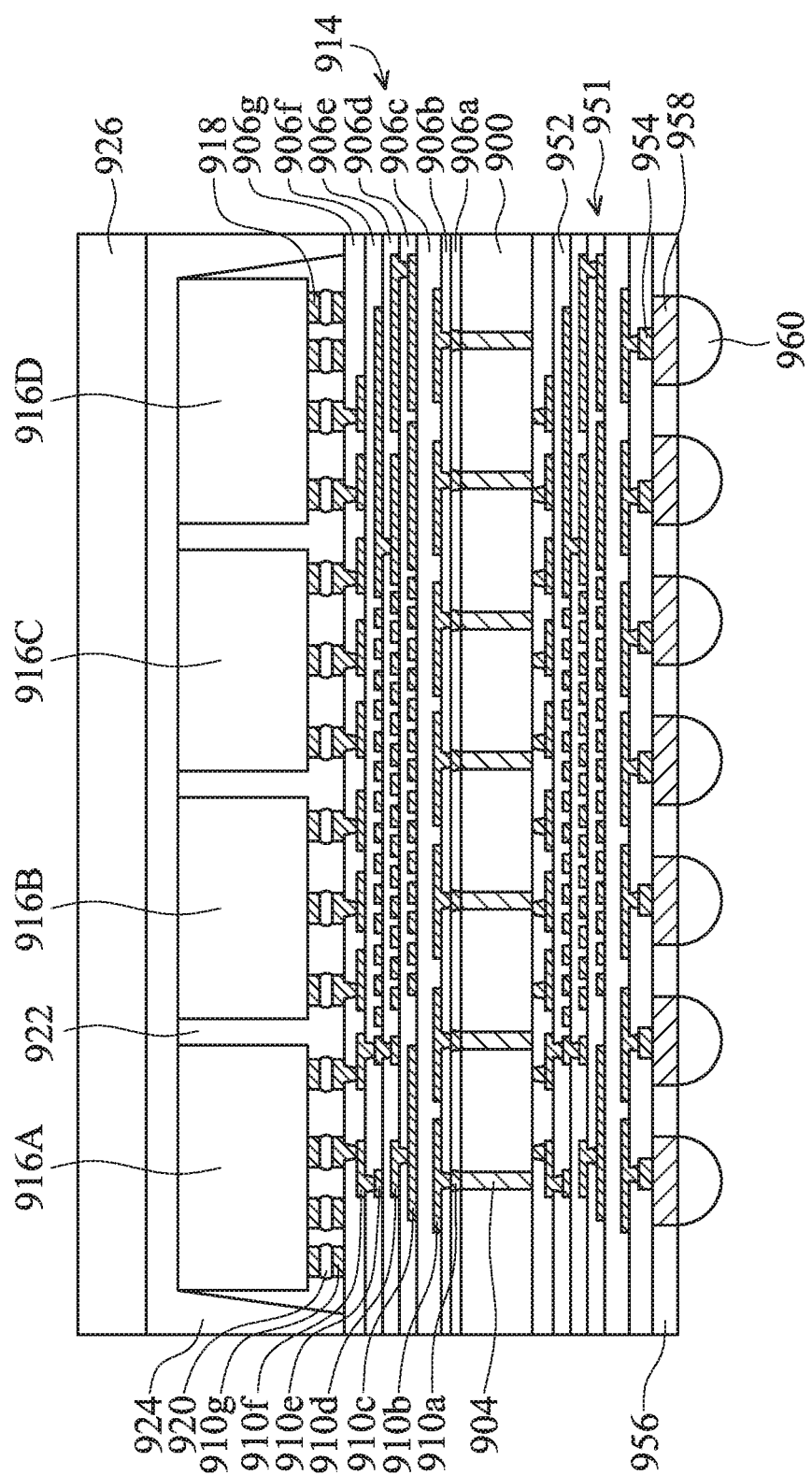

As shown in FIG. 11C, a protective layer 956, conductive pads 958, and conductive connectors 960 are formed, in accordance with some embodiments. The material and formation method of the protective layer 956, the conductive pads 958, and the conductive connectors 960 in FIG. 11C may be the same as or similar to those of the protective layer 136, conductive pads 138, and conductive connectors 140 in FIG. 1H.

Figure 11D:
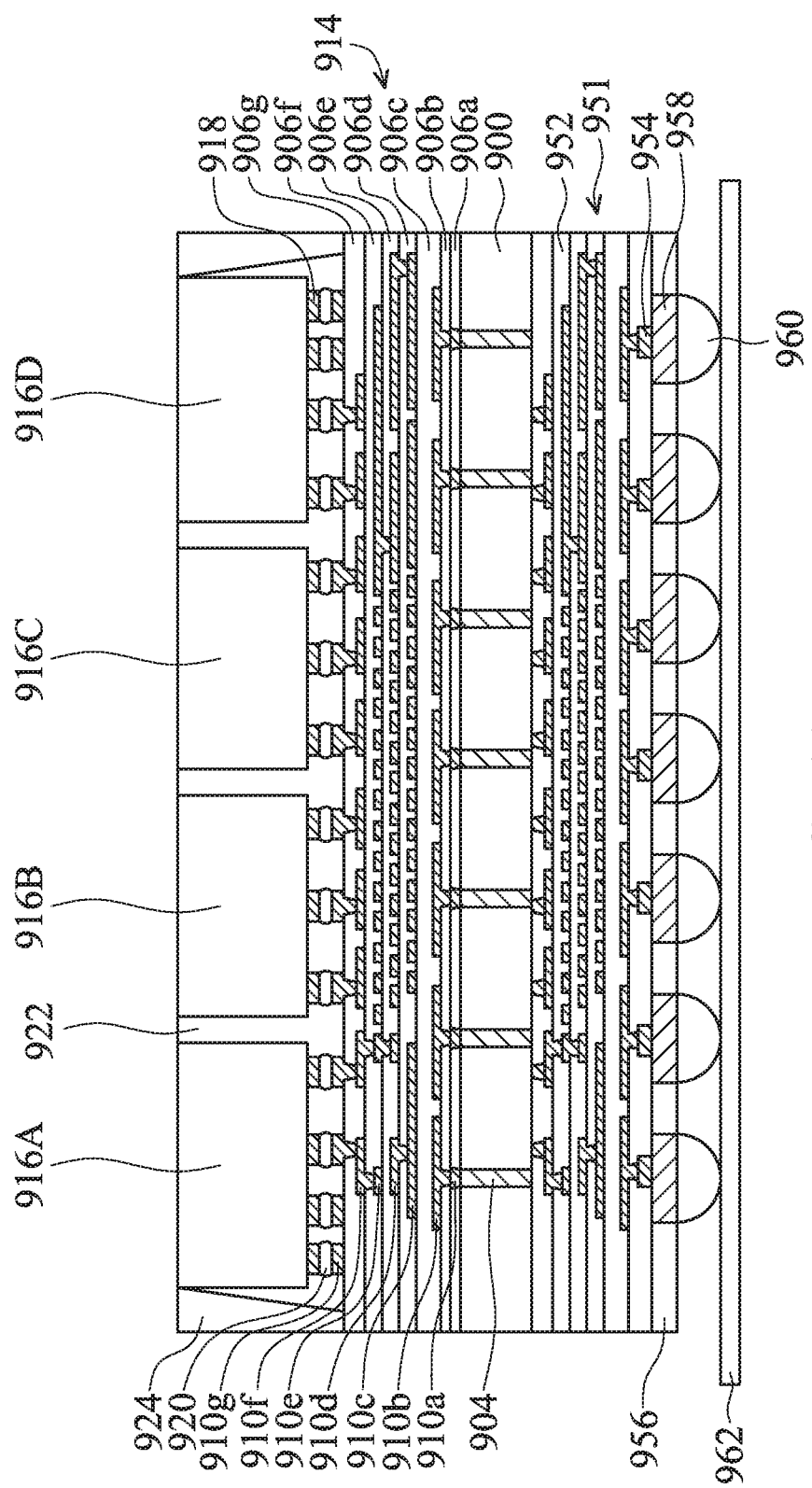

As shown in FIG. 11D, the structure in FIG. 11C is attached onto a carrier tape 962, in accordance with some embodiments. Afterwards, the temporary support substrate 926 is removed, and the protective layer 924 is further thinned to expose one or more of the chip structures 916A-916D, as shown in FIG. 11D in accordance with some embodiments. In some embodiments, each of the chip structures 916A-916D is exposed after the thinning of the protective layer 924.

In some embodiments, a sawing process is used to cut through the structure shown in FIG. 11D into multiple separate package structures. These package structures may then be integrated into other larger package structures.

However, embodiments of the disclosure are not limited thereto. Many variations and/or modifications can be made to embodiments of the disclosure. In some other embodiments, the sawing process is not performed to separate the structure in FIG. 11D into multiple smaller package structures. The entirety of the wafer-level package structure may then be integrated into a large package structure.

Figure 11E:
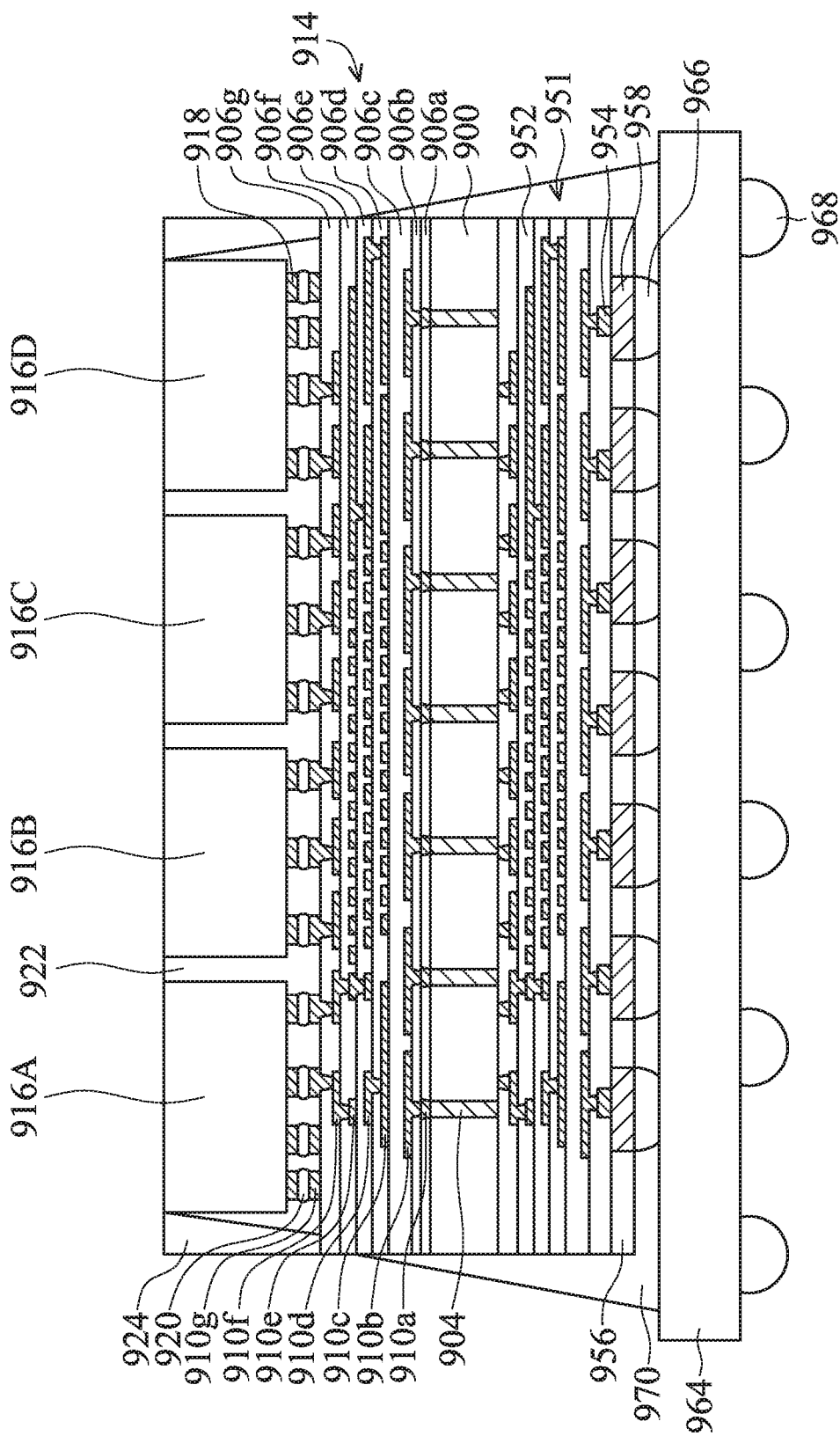

As shown in FIG. 11E, the package structure shown in FIG. 11D is picked from the carrier tape 962 and placed over a package substrate 964, in accordance with some embodiments. The package substrate 964 in FIG. 11E may be the same as or similar to the package substrate 144 in FIG. 1J. The package substrate 964 further includes multiple conductive bumps 968. The conductive bumps 968 may be used to connect another element such as a circuit board. In some embodiments, the package structure shown in FIG. 11D is bonded to the package substrate 964 through conductive connectors 966. The material and formation method of the conductive connectors 966 in FIG. 11E may be the same as or similar to those of the conductive connectors 148 in FIG. 1J.

In some embodiments, an underfill material 970 is formed to surround and protect the conductive connectors 966, in accordance with some embodiments. The material and formation method of the underfill material 970 may be the same as or similar to those of the underfill material 130 in FIG. 1F.

Figure 12:
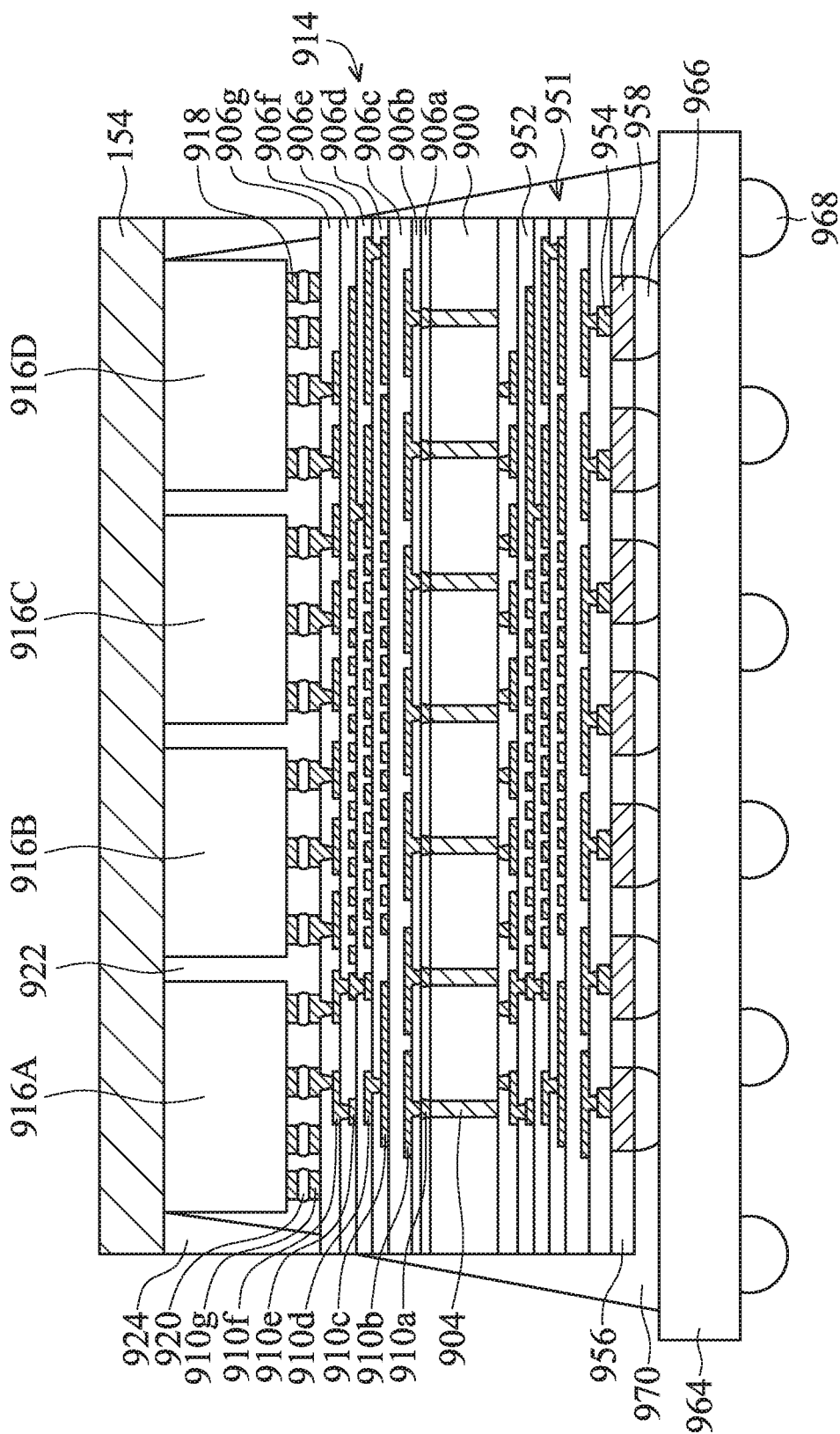
FIG. 12 is a cross-sectional view of a portion of a package structure, in accordance with some embodiments.

Many variations and/or modifications can be made to embodiments of the disclosure. FIG. 12 is a cross-sectional view of a portion of a package structure, in accordance with some embodiments. In some embodiments, a package structure similar to the structure shown in FIG. 11E is formed. Similar to the embodiments shown in FIG. 3, a thermal conductive structure 154 is formed over the chip structures 916A-916D, as shown in FIG. 12 in accordance with some embodiments. Due to the thermal conductive structure 154, the heat dissipation of the chip structures 916A-916D may be improved, which facilitates the performance and reliability of the package structure.

Many variations and/or modifications can be made to embodiments of the disclosure. In some embodiments, the conductive structures formed in the carrier substrate have slanted sidewalls. In some embodiments, a first portion of the conductive structure closer to the chip structures is wider than a second portion of the conductive structure closer to the package substrate.

Figure 13A:
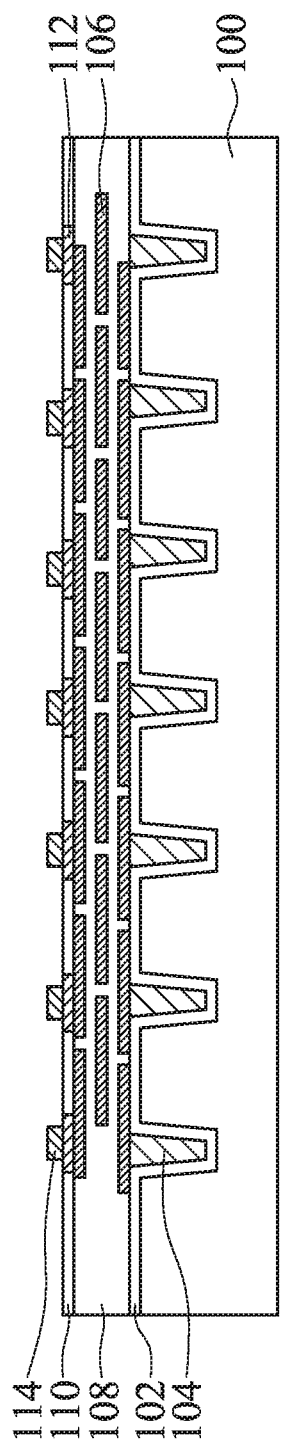
FIGS. 13A-13B are cross-sectional views of various stages of a process for forming a portion of a package structure, in accordance with some embodiments.
Figure 13B:
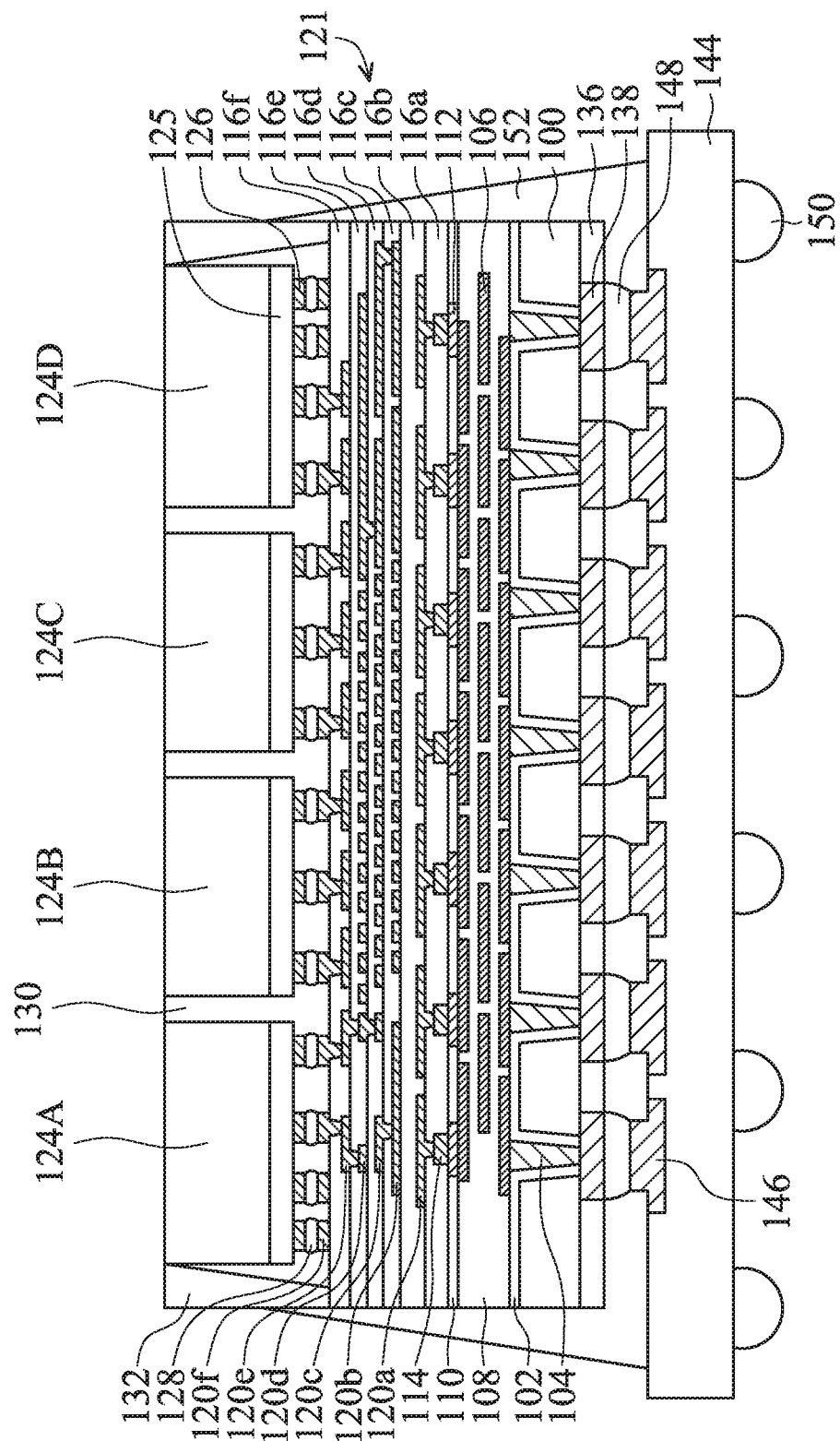

FIGS. 13A-13B are cross-sectional views of various stages of a process for forming a portion of a package structure, in accordance with some embodiments. As shown in FIG. 13A, a structure similar to the structure shown in FIG. 1A is formed. In some embodiments, the openings used for containing the conductive structures 104 and the dielectric layer 102 are formed to have slanted sidewalls. Therefore, the conductive structures 104 also have slanted sidewalls.

Afterwards, the processes similar to those illustrated in FIGS. 1B-1J are performed. As a result, the package structure shown in FIG. 13B is formed, in accordance with some embodiments. In some embodiments, each top end of the conductive structures 104 is wider than the respective bottom end of the respective conductive structure 104.

Many variations and/or modifications can be made to embodiments of the disclosure. In some embodiments, one or more device elements are formed in the carrier substrate 100 and/or 900. In some embodiments, the device elements are passive device elements. In some embodiments, the device elements are capacitors such as deep trench capacitors.

Figure 14:
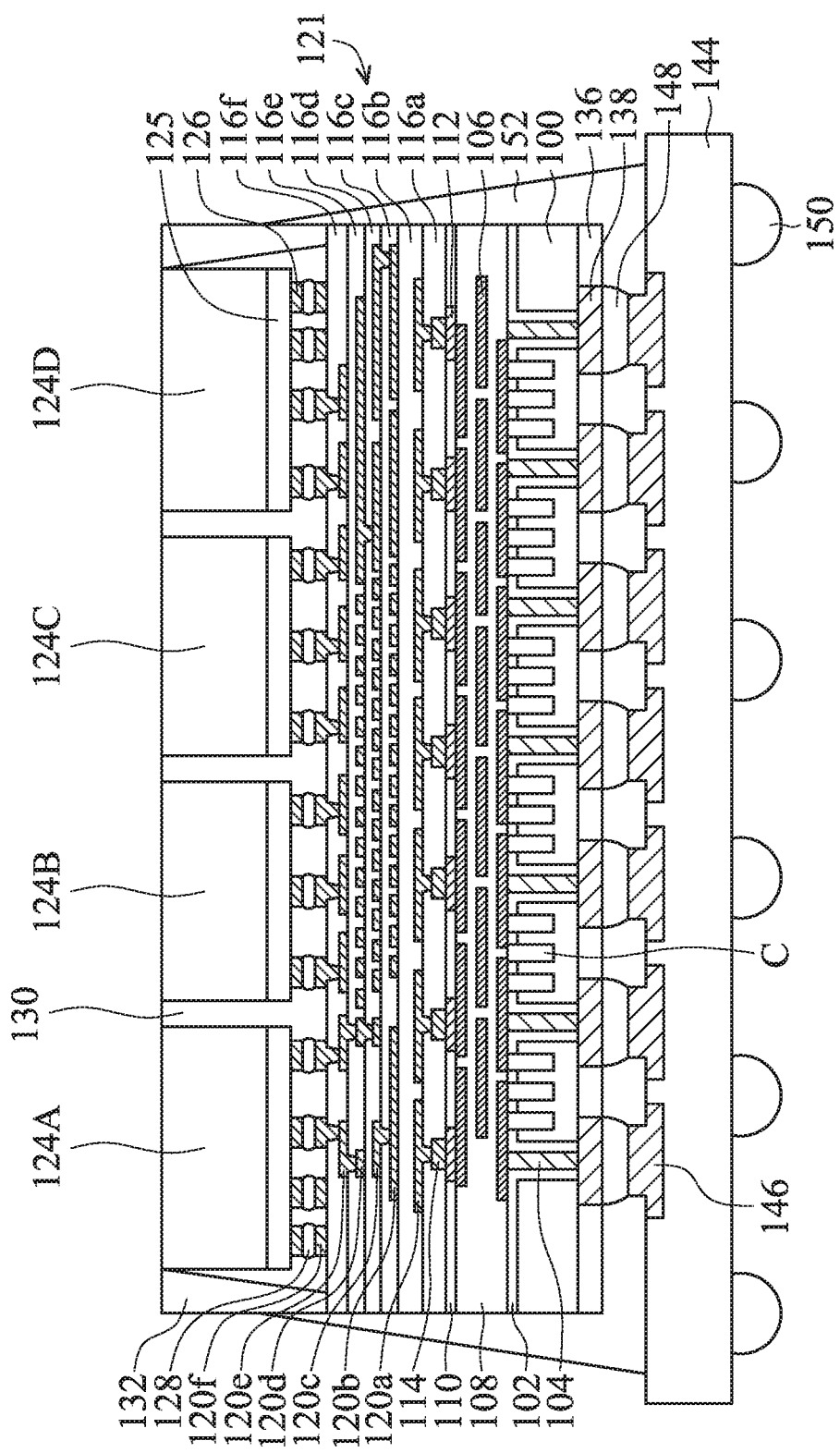
FIG. 14 is a cross-sectional view of a portion of a package structure, in accordance with some embodiments.

FIG. 14 is a cross-sectional view of a portion of a package structure, in accordance with some embodiments. In some embodiments, a structure similar to that shown in FIG. 1J is formed. In some embodiments, multiple capacitors C are formed in the carrier substrate 100. In some embodiments, the capacitors C are formed before the formation of the conductive structures 104. In some other embodiments, the capacitors C are formed after the formation of the conductive structures. In some embodiments, the capacitors C are formed before the formation of the redistribution structure 121.

Figure 15:
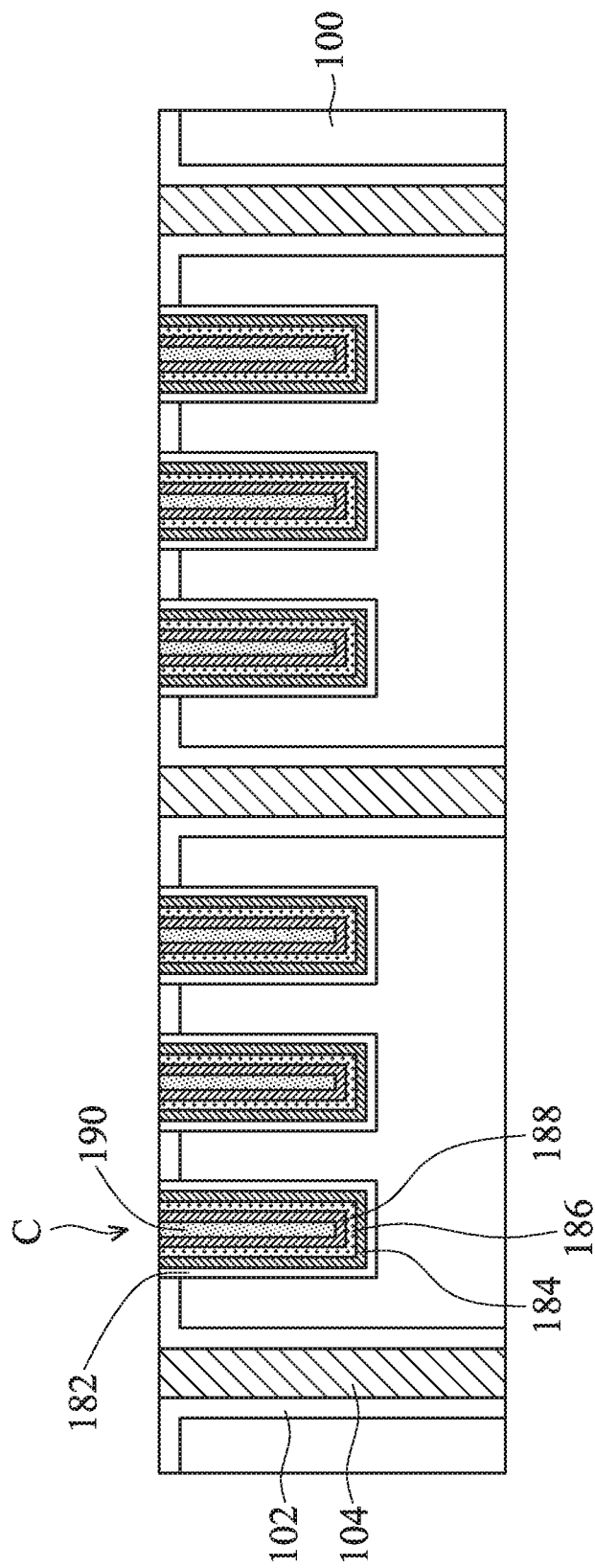
FIG. 15 is a cross-sectional view of a portion of a package structure, in accordance with some embodiments.

FIG. 15 is a cross-sectional view of a portion of a package structure, in accordance with some embodiments. In some embodiments, FIG. 15 is an enlarged cross-sectional view showing a portion of the carrier substrate 100. In some embodiments, multiple capacitors C are formed in the carrier substrate 100. The capacitors C may be deep trench capacitors.

In some embodiments, after the formation of the conductive structures 104 and before the formation of the redistribution structure 121, the carrier substrate 100 is partially removed to form multiple trenches. Afterwards, a dielectric layer 182, a first electrode layer 184, a capacitor dielectric layer 186, a second electrode layer 188, and a dielectric filling layer 190 are sequentially deposited over the carrier substrate 100 to fill the trenches. Afterwards, a planarization process is used to remove the portions of these layers outside of the trenches. As a result, the remaining portions of these layers form the capacitors C. The capacitors may also be formed in the carrier substrate 100 or 900 of the structure shown in FIGS. 3, 4J, 5, 6E, 7, 8, 9K, 10, 11E, 12, and/or 13B.

Embodiments of the disclosure form a package structure including multiple chip structures, a polymer-containing redistribution structure, and a reinforced plate. Multiple conductive structures that penetrate through the reinforced plate are formed to form electrical connection between devices elements formed on opposite surfaces of the reinforced plate. Due to the reinforced plate having high strength and a low coefficient of thermal expansion, the thermal expansion difference between the elements above and below the carrier substrate may be limited. The risk of warpage is significantly reduced or prevented. Therefore, the reliability and performance of the package structure are greatly improved.

In accordance with some embodiments, a method for forming a package structure is provided. The method includes forming a plurality of conductive structures in a carrier substrate and forming a redistribution structure over the carrier substrate. The redistribution structure has a plurality of polymer-containing layers and a plurality of conductive features. The method also includes bonding a plurality of chip structures over the redistribution structure and forming a protective layer over the redistribution structure to surround the chip structures. The method further includes forming a plurality of conductive connectors over a surface of the carrier substrate. The carrier substrate is between the redistribution structure and the conductive connectors.

In accordance with some embodiments, a method for forming a package structure is provided. The method includes forming a plurality of conductive vias in a carrier substrate and forming a redistribution structure over the carrier substrate. The redistribution structure has a plurality of polymer-containing layers and a plurality of conductive features. The method also includes disposing a plurality of chip structures over the redistribution structure. The method further includes bonding the carrier substrate to a package structure.

In accordance with some embodiments, a package structure is provided. The package structure includes a reinforced plate and a plurality of conductive structures penetrating through the reinforced plate. The package structure also includes a redistribution structure over the reinforced plate. The redistribution structure comprises a plurality of polymer-containing layers and a plurality of conductive features. The package structure further includes a plurality of chip structures over the redistribution structure and a protective layer surrounding the chip structures. In addition, the package structure includes a plurality of conductive connectors below a bottom surface of the reinforced plate. The reinforced plate is between the redistribution structure and the conductive connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   forming a plurality of conductive structures in a carrier substrate;
   forming an interconnection structure over the carrier substrate and the conductive structures, wherein the interconnection structure comprises a passivation layer, a plurality of silicon-containing oxide layers, and a plurality of first conductive features, wherein the passivation layer is thinner than the plurality of silicon-containing oxide layers;
   forming a redistribution structure over the interconnection structure, wherein the redistribution structure has a plurality of polymer-containing layers and a plurality of second conductive features, and the redistribution structure is in direct contact with the passivation layer of the interconnection structure;
   bonding a plurality of chip structures over the redistribution structure;
   forming a protective layer over the redistribution structure to surround the chip structures; and
   forming a plurality of conductive connectors over a surface of the carrier substrate, wherein the carrier substrate is between the redistribution structure and the conductive connectors.

2. The method for forming a package structure as claimed in claim 1, further comprising bonding the conductive connectors to a package substrate.

3. The method for forming a package structure as claimed in claim 1, further comprising thinning the carrier substrate to expose the conductive structures before the conductive connectors are formed.

4. The method for forming a package structure as claimed in claim 1, wherein the carrier substrate is made of a semiconductor material.

5. The method for forming a package structure as claimed in claim 4, further comprising forming a dielectric layer in the carrier substrate before the conductive structures are formed, wherein the dielectric layer electrically isolates the carrier substrate and the conductive structures.

6. The method for forming a package structure as claimed in claim 1, wherein the carrier substrate is made of a dielectric material.

7. The method for forming a package structure as claimed in claim 1, further comprising forming at least one deep trench capacitor in the carrier substrate before the redistribution structure is formed.

8. The method for forming a package structure as claimed in claim 1, further comprising forming a second redistribution structure over the surface of the carrier substrate before the conductive connectors are formed, wherein the carrier substrate is between the redistribution structure and the second redistribution structures.

9. The method for forming a package structure as claimed in claim 8, wherein the second redistribution structure comprises a plurality of second polymer-containing layers and a plurality of third conductive features.

10. The method for forming a package structure as claimed in claim 1, further comprising grinding the protective layer to expose at least one of the chip structures while the conductive connectors are attached to a carrier.

11. A method for forming a package structure, comprising:
    forming a plurality of conductive vias in a carrier substrate;
    forming an interconnection structure over the carrier substrate and the conductive structures, wherein the interconnection structure comprises a passivation layer, a plurality of silicon-containing oxide layers, and a plurality of first conductive features, wherein the passivation layer is thinner than the plurality of silicon-containing oxide layers;
    forming a redistribution structure over the carrier substrate, wherein the redistribution structure has a plurality of polymer-containing layers and a plurality of second conductive features, and the redistribution structure is in direct contact with the passivation layer of the interconnection structure;
    disposing a plurality of chip structures over the redistribution structure;
    bonding the carrier substrate to a package structure; and
    forming a thermal conductive structure directly on the chip structures after the chip structures are disposed over the redistribution structure, wherein the thermal conductive structure extends across opposite edges of the chip structures.

12. The method for forming a package structure as claimed in claim 11, further comprising:
    forming a dielectric layer in the carrier substrate;
    forming a conductive material over the dielectric layer; and
    partially removing the conductive material, wherein remaining portions of the conductive material form the conductive vias.

13. The method for forming a package structure as claimed in claim 12, further comprising thinning the carrier substrate to expose the conductive vias after the chip structures are disposed and before the carrier substrate is bonded to the package structure.

14. A package structure, comprising:
    a reinforced plate;
    a plurality of conductive structures penetrating through the reinforced plate;
    an interconnection structure over the reinforced plate and the conductive structures, wherein the interconnection structure comprises a passivation layer, a plurality of silicon-containing oxide layers, and a plurality of first conductive features, wherein the passivation layer is thinner than the plurality of silicon-containing oxide layers;
    a redistribution structure over the interconnection structure, wherein the redistribution structure comprises a plurality of polymer-containing layers and a plurality of second conductive features, and the redistribution structure is in direct contact with the passivation layer of the interconnection structure;
    a plurality of chip structures over the redistribution structure;

a protective layer surrounding the chip structures; and a plurality of conductive connectors below a bottom surface of the reinforced plate, wherein the reinforced plate is between the redistribution structure and the conductive connectors.

15. The package structure as claimed in claim 14, wherein the reinforced plate has a first thickness, the redistribution structure has a second thickness, and a ratio of the first thickness to the second thickness is in a range from about 0.5 to about 1.

16. The package structure as claimed in claim 14, further comprising a second redistribution structure, wherein the second redistribution structure is between the reinforced plate and the conductive connectors, and the second redistribution structure comprises a plurality of second polymer-containing layers and a plurality of third conductive features.

17. The package structure as claimed in claim 14, further comprising:

a dielectric layer extending along a top surface of the reinforced plate and extending along sidewalls of the conductive structures, wherein the reinforced plate is substantially as wide as the redistribution structure.

18. The package structure as claimed in claim 14, further comprising at least one deep trench capacitor formed in the reinforced plate.

19. The method for forming a package structure as claimed in claim 11, wherein the interconnection structure is formed before the redistribution structure is formed.

20. The package structure as claimed in claim 14, wherein the reinforced plate is made of a glass material.

* * * * *